(12) United States Patent
Faguet et al.

(10) Patent No.: US 9,157,152 B2
(45) Date of Patent: Oct. 13, 2015

(54) VAPOR DEPOSITION SYSTEM

(75) Inventors: Jacques Faguet, Albany, NY (US); Eric M. Lee, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 1134 days.

(21) Appl. No.: 13/025,133

(22) Filed: Feb. 10, 2011

(65) Prior Publication Data

US 2011/0126762 A1 Jun. 2, 2011

Related U.S. Application Data

(63) Continuation-in-part of application No. 11/693,067, filed on Mar. 29, 2007, now abandoned.

(51) Int. Cl.
*C23C 16/452* (2006.01)
*C23C 16/44* (2006.01)
(Continued)

(52) U.S. Cl.
CPC ............... *C23C 16/452* (2013.01); *C23C 16/44* (2013.01); *C23C 16/4557* (2013.01); *C23C 16/45563* (2013.01); *C23C 16/45565* (2013.01); *C23C 16/487* (2013.01); *C23C 16/50* (2013.01)

(58) Field of Classification Search
CPC   C23C 16/452; C23C 16/44; C23C 16/45565; C23C 16/487; C23C 16/45563; C23C 16/50; C23C 16/4557
USPC ........... 118/723 HC, 723 R, 724; 156/345.35, 156/345.37
See application file for complete search history.

(56) References Cited

U.S. PATENT DOCUMENTS 4,057,396 A   11/1977   Matovich
4,148,575 A   4/1979   Siryj
(Continued)

FOREIGN PATENT DOCUMENTS

| JP | 59121920 A | 7/1994 |
|---|---|---|
| JP | 2005121240 A | 5/2005 |

OTHER PUBLICATIONS

U.S. Patent and Trademark Office, Non-final Office Action issued in related U.S. Appl. No. 12/042,039 dated Feb. 2, 2012, 15 pp.
(Continued)

*Primary Examiner* — Rudy Zervigon
(74) *Attorney, Agent, or Firm* — Wood, Herron & Evans, LLP

(57) ABSTRACT

A system for depositing a thin film on a substrate using a vapor deposition process is described. The deposition system includes a process chamber having a vacuum pumping system configured to evacuate the process chamber, a substrate holder coupled to the process chamber and configured to support the substrate, a gas distribution system coupled to the process chamber and configured to introduce a film forming composition to a process space in the vicinity of a surface of the substrate, a non-ionizing heat source separate from the substrate holder that is configured to receive a flow of the film forming composition and to cause thermal fragmentation of one or more constituents of the film forming composition when heated, and one or more power sources coupled to the heating element array and configured to provide an electrical signal to the at least one heating element zone. The deposition system further includes a remote source coupled to the process chamber and configured to supply a reactive composition to the process chamber to chemically interact with the substrate, wherein the remote source comprises a remote plasma generator, a remote radical generator, a remote ozone generator, or a water vapor generator, or a combination of two or more thereof.

17 Claims, 19 Drawing Sheets

(51) Int. Cl.
  *C23C 16/455*  (2006.01)
  *C23C 16/48*  (2006.01)
  *C23C 16/50*  (2006.01)

(56) References Cited

U.S. PATENT DOCUMENTS

| | | | |
|---|---|---|---|
| 4,220,846 A | 9/1980 | Rice et al. | |
| 4,310,747 A | 1/1982 | Rice et al. | |
| 4,334,350 A | 6/1982 | Rice et al. | |
| 4,830,702 A * | 5/1989 | Singh et al. | 427/577 |
| 4,942,057 A * | 7/1990 | Steinwandel et al. | 427/578 |
| 4,958,592 A | 9/1990 | Anthony et al. | |
| 4,970,986 A | 11/1990 | Anthony et al. | |
| 4,974,544 A * | 12/1990 | Ohta | 118/723 HC |
| 4,977,855 A | 12/1990 | Ohmi et al. | 118/722 |
| 5,054,421 A * | 10/1991 | Ito et al. | 118/723 HC |
| 5,068,871 A | 11/1991 | Uchida et al. | |
| 5,112,466 A * | 5/1992 | Ohta et al. | 204/298.05 |
| 5,114,559 A * | 5/1992 | Ohta et al. | 204/298.05 |
| 5,133,849 A * | 7/1992 | Kinoshita et al. | 204/298.05 |
| 5,149,375 A * | 9/1992 | Matsuyama | 118/719 |
| 5,160,544 A * | 11/1992 | Garg et al. | 118/724 |
| 5,204,314 A | 4/1993 | Kirlin et al. | |
| 5,227,340 A | 7/1993 | Pintchovski et al. | |
| 5,268,202 A | 12/1993 | You et al. | |
| 5,273,588 A | 12/1993 | Foster et al. | |
| 5,318,809 A | 6/1994 | Sussman | |
| 5,350,480 A * | 9/1994 | Gray | 156/345.26 |
| 5,447,568 A * | 9/1995 | Hayakawa et al. | 118/715 |
| 5,518,572 A * | 5/1996 | Kinoshita et al. | 156/345.34 |
| 5,536,323 A | 7/1996 | Kirlin et al. | |
| 5,541,566 A * | 7/1996 | Deeney | 336/177 |
| 5,554,222 A * | 9/1996 | Nishihara et al. | 118/723 HC |
| 5,571,332 A * | 11/1996 | Halpern | 118/723 HC |
| 5,580,822 A * | 12/1996 | Hayakawa et al. | 427/250 |
| 5,594,280 A | 1/1997 | Sekiguchi et al. | |
| 5,609,720 A * | 3/1997 | Lenz et al. | 438/715 |
| 5,833,753 A | 11/1998 | Herlinger et al. | |
| 5,919,522 A | 7/1999 | Baum et al. | |
| 5,942,854 A * | 8/1999 | Ryoji et al. | 315/111.21 |
| 5,951,772 A * | 9/1999 | Matsuse et al. | 118/723 R |
| 5,958,510 A | 9/1999 | Sivaramakrishnam et al. | |
| 5,976,992 A * | 11/1999 | Ui et al. | 438/788 |
| 5,997,650 A | 12/1999 | Herlinger et al. | |
| 6,013,155 A * | 1/2000 | McMillin et al. | 156/345.33 |
| 6,086,679 A | 7/2000 | Lee et al. | |
| 6,089,182 A * | 7/2000 | Hama | 118/723 I |
| 6,106,630 A | 8/2000 | Frankel | |
| 6,140,456 A | 10/2000 | Lee et al. | |
| 6,211,622 B1 * | 4/2001 | Ryoji et al. | 315/111.21 |
| 6,214,706 B1 | 4/2001 | Madan et al. | |
| 6,325,857 B1 * | 12/2001 | Miyoshi | 118/724 |
| 6,331,211 B1 | 12/2001 | Xu et al. | |
| 6,349,669 B1 * | 2/2002 | Matsumura et al. | 118/723 HC |
| 6,417,369 B1 | 7/2002 | Xu et al. | |
| 6,427,622 B2 | 8/2002 | Madan et al. | |
| 6,432,206 B1 | 8/2002 | Tolt | |
| 6,432,259 B1 | 8/2002 | Noorbakhsh et al. | |
| 6,453,992 B1 * | 9/2002 | Kim | 165/206 |
| 6,460,482 B1 * | 10/2002 | Kuibira et al. | 118/723 R |
| 6,499,425 B1 * | 12/2002 | Sandhu et al. | 118/723 E |
| 6,576,354 B2 | 6/2003 | Tsukatani et al. | |
| 6,582,780 B1 | 6/2003 | Tolt | |
| 6,592,771 B1 * | 7/2003 | Yamanaka et al. | 216/63 |
| 6,593,548 B2 * | 7/2003 | Matsumura et al. | 219/390 |
| 6,641,698 B2 * | 11/2003 | Kabansky | 156/345.35 |
| 6,653,212 B1 * | 11/2003 | Yamanaka et al. | 438/485 |
| 6,656,281 B1 * | 12/2003 | Ueda et al. | 118/695 |
| 6,656,540 B2 * | 12/2003 | Sakamoto et al. | 427/564 |
| 6,682,602 B2 * | 1/2004 | Vaartstra | 118/715 |
| 6,692,574 B1 | 2/2004 | Tolt | |
| 6,692,649 B2 * | 2/2004 | Collison et al. | 216/67 |
| 6,709,512 B2 * | 3/2004 | Yamoto et al. | 117/90 |
| 6,723,664 B2 * | 4/2004 | Matsumura et al. | 438/788 |
| 6,740,853 B1 | 5/2004 | Johnson et al. | |
| 6,758,224 B2 * | 7/2004 | Nogami | 134/22.1 |
| 6,787,481 B2 * | 9/2004 | Asai et al. | 438/785 |
| 6,872,259 B2 | 3/2005 | Strang | |
| 6,887,578 B2 | 5/2005 | Gleason et al. | |
| 6,942,892 B1 * | 9/2005 | Ishibashi | 427/237 |
| 7,005,047 B2 | 2/2006 | Ishikura et al. | |
| 7,011,866 B1 * | 3/2006 | Yamanaka et al. | 427/255.28 |
| 7,175,713 B2 * | 2/2007 | Thakur et al. | 118/715 |
| 7,208,421 B2 * | 4/2007 | Sakamoto et al. | 438/715 |
| 7,253,084 B2 * | 8/2007 | Todd et al. | 438/478 |
| 7,262,500 B2 * | 8/2007 | Sakamoto et al. | 257/750 |
| 7,273,526 B2 * | 9/2007 | Shinriki et al. | 118/715 |
| 7,357,846 B2 * | 4/2008 | Fujishima | 156/345.32 |
| 7,485,338 B2 | 2/2009 | Faguet | |
| 7,543,546 B2 * | 6/2009 | Shibata et al. | 118/723 E |
| 7,588,799 B2 * | 9/2009 | Matsuda et al. | 427/250 |
| 7,604,708 B2 * | 10/2009 | Wood et al. | 156/345.35 |
| 7,670,469 B2 * | 3/2010 | Ahn et al. | 204/298.26 |
| 7,695,590 B2 * | 4/2010 | Hanawa et al. | 156/345.39 |
| 7,712,434 B2 * | 5/2010 | Dhindsa et al. | 118/723 E |
| 7,722,719 B2 * | 5/2010 | Lei et al. | 118/715 |
| 7,740,706 B2 * | 6/2010 | Park et al. | 118/715 |
| 7,758,698 B2 * | 7/2010 | Bang et al. | 118/715 |
| 7,776,156 B2 * | 8/2010 | Long et al. | 118/725 |
| 7,811,411 B2 * | 10/2010 | Lu et al. | 156/345.48 |
| 7,854,962 B2 | 12/2010 | Kasai et al. | |
| 7,895,970 B2 * | 3/2011 | Honda et al. | 118/723 E |
| 7,923,374 B2 * | 4/2011 | Sakamoto et al. | 438/715 |
| 7,972,441 B2 * | 7/2011 | Yokota et al. | 118/715 |
| 7,976,631 B2 * | 7/2011 | Burrows et al. | 118/715 |
| 8,006,639 B2 * | 8/2011 | Kim et al. | 118/723 HC |
| 8,052,795 B2 * | 11/2011 | Kang et al. | 118/715 |
| 8,105,440 B2 * | 1/2012 | Nogami | 134/22.18 |
| 8,123,860 B2 * | 2/2012 | Thakur et al. | 118/715 |
| 8,123,902 B2 * | 2/2012 | Brillhart et al. | 156/345.33 |
| 8,137,467 B2 * | 3/2012 | Meinhold et al. | 118/724 |
| 8,147,786 B2 * | 4/2012 | Tsuda | 423/240 R |
| 8,235,001 B2 * | 8/2012 | Sano et al. | 118/696 |
| 8,272,347 B2 * | 9/2012 | Nasman et al. | 118/723 E |
| 8,291,856 B2 * | 10/2012 | Nasman et al. | 118/723 HC |
| 8,291,857 B2 * | 10/2012 | Lam et al. | 118/723 ME |
| 8,361,550 B2 * | 1/2013 | Kakimoto et al. | 427/255.31 |
| 8,367,566 B2 * | 2/2013 | Sano et al. | 438/503 |
| 8,372,688 B2 * | 2/2013 | Kawano et al. | 438/102 |
| 8,419,854 B2 * | 4/2013 | Hatanaka et al. | 118/715 |
| 8,940,367 B2 * | 1/2015 | Harig et al. | 427/248.1 |
| 2001/0031541 A1 | 10/2001 | Madan et al. | |
| 2002/0096188 A1 * | 7/2002 | Nogami | 134/1.1 |
| 2002/0176807 A1 | 11/2002 | Gubernator et al. | |
| 2002/0189757 A1 | 12/2002 | Denton et al. | |
| 2003/0000471 A1 * | 1/2003 | Yoon et al. | 118/715 |
| 2003/0013280 A1 * | 1/2003 | Yamanaka | 438/487 |
| 2003/0021595 A1 | 1/2003 | Xu et al. | |
| 2003/0032265 A1 | 2/2003 | Deng et al. | |
| 2003/0047282 A1 * | 3/2003 | Sago et al. | 156/345.34 |
| 2003/0089315 A1 * | 5/2003 | Matsuda et al. | 118/723 AN |
| 2003/0164225 A1 * | 9/2003 | Sawayama et al. | 156/345.29 |
| 2003/0198578 A1 | 10/2003 | Lee et al. | |
| 2004/0055539 A1 | 3/2004 | Lee et al. | |
| 2004/0069231 A1 | 4/2004 | Chae | |
| 2004/0091636 A1 * | 5/2004 | Sakamoto et al. | 427/569 |
| 2004/0106269 A1 | 6/2004 | Deng et al. | |
| 2004/0118342 A1 * | 6/2004 | Cheng et al. | 118/715 |
| 2004/0144489 A1 * | 7/2004 | Satoh et al. | 156/345.35 |
| 2004/0149211 A1 | 8/2004 | Ahn et al. | |
| 2004/0163601 A1 * | 8/2004 | Kadotani et al. | 118/728 |
| 2004/0168769 A1 * | 9/2004 | Matsuoka et al. | 156/345.33 |
| 2004/0219789 A1 * | 11/2004 | Wood et al. | 438/690 |
| 2004/0231798 A1 * | 11/2004 | Gondhalekar et al. | 156/345.33 |
| 2004/0250765 A1 * | 12/2004 | Ishizaka et al. | 118/715 |
| 2005/0028736 A1 | 2/2005 | Long | |
| 2005/0081788 A1 * | 4/2005 | Jurgensen et al. | 118/718 |
| 2005/0201575 A1 | 9/2005 | Koshida et al. | |
| 2005/0223982 A1 * | 10/2005 | Park et al. | 118/715 |
| 2005/0249876 A1 * | 11/2005 | Kawahara et al. | 427/255.34 |
| 2005/0271809 A1 | 12/2005 | Kobrin et al. | |
| 2006/0021572 A1 | 2/2006 | Wolden | 118/715 |
| 2006/0137607 A1 * | 6/2006 | Seo et al. | 118/715 |
| 2006/0191477 A1 * | 8/2006 | Sakamoto et al. | 118/715 |

(56) References Cited

U.S. PATENT DOCUMENTS

| | | |
|---|---|---|
| 2006/0191481 A1* | 8/2006 | Sakamoto et al. ..... 118/723 MP |
| 2006/0219360 A1 | 10/2006 | Iwasaki |
| 2007/0163713 A1 | 7/2007 | Kasai et al. |
| 2007/0218200 A1* | 9/2007 | Suzuki et al. ............... 427/248.1 |
| 2007/0221332 A1* | 9/2007 | Honda et al. ............. 156/345.47 |
| 2007/0234962 A1* | 10/2007 | Suzuki et al. ................. 118/726 |
| 2008/0035059 A1 | 2/2008 | Wang et al. |
| 2008/0035060 A1 | 2/2008 | Wang et al. |
| 2008/0047489 A1 | 2/2008 | Chung et al. |
| 2008/0078325 A1 | 4/2008 | Matsuda et al. |
| 2008/0179007 A1* | 7/2008 | Collins et al. ............. 156/345.35 |
| 2008/0179008 A1* | 7/2008 | Collins et al. ............. 156/345.35 |
| 2008/0241377 A1 | 10/2008 | Faguet |
| 2009/0095218 A1* | 4/2009 | Meinhold et al. ............. 118/708 |
| 2009/0095219 A1* | 4/2009 | Meinhold et al. ............. 118/708 |
| 2009/0095220 A1* | 4/2009 | Meinhold et al. ............. 118/712 |
| 2009/0095425 A1* | 4/2009 | Sakamoto et al. ........ 156/345.52 |
| 2009/0098276 A1* | 4/2009 | Burrows et al. ..................... 427/8 |
| 2009/0191109 A1* | 7/2009 | Tsuda ....................... 423/240 R |
| 2009/0223452 A1 | 9/2009 | Nasman et al. |
| 2009/0226614 A1* | 9/2009 | Nasman ................... 427/255.28 |
| 2009/0325372 A1* | 12/2009 | Harada ......................... 438/591 |
| 2010/0230387 A1* | 9/2010 | Okesaku et al. ................ 216/69 |
| 2010/0263593 A1* | 10/2010 | Kontani et al. ........ 118/723 HC |
| 2010/0288439 A1 | 11/2010 | Ishibashi et al. |
| 2011/0061595 A1 | 3/2011 | Nasman et al. |
| 2011/0070370 A1 | 3/2011 | Teo et al. |
| 2011/0126762 A1* | 6/2011 | Faguet et al. ........... 118/723 ER |
| 2011/0303145 A1 | 12/2011 | Lee et al. |
| 2011/0305831 A1 | 12/2011 | Lee et al. |
| 2013/0112352 A1* | 5/2013 | Hirayama et al. ....... 156/345.41 |

OTHER PUBLICATIONS

International Search Report issued in Application No. PCT/US08/058087 mailed Jul. 1, 2008.

Written Opinion issued in Application No. PCT/US08/058087 mailed Jul. 1, 2008.

U.S. Patent and Trademark Office, Final Office Action issued in related U.S. Appl. No. 11/693,067 dated Apr. 12, 2011, 13 pp.

International Search Report and Written Opinion issued in related International Application No. PCT/US11/33393 mailed Jul. 20, 2011, 11 pp.

U.S. Patent and Trademark Office, Non-final Office Action issued in corresponding U.S. Appl. No. 11/693,067 dated Aug. 17, 2011, 16 pp.

International Search Report and Written Opinion issued in related Application No. PCT/US12/024045 mailed Oct. 15, 2012, 16 pp.

* cited by examiner

VAPOR DEPOSITION SYSTEM

CROSS-REFERENCE TO RELATED APPLICATIONS

This application is a continuation-in-part of U.S. Ser. No. 11/693,067, entitled "VAPOR DEPOSITION SYSTEM AND METHOD OF OPERATING", and filed Mar. 29, 2007. The entire content of this application is herein incorporated by reference.

BACKGROUND OF THE INVENTION

1. Field of Invention

The present invention relates to a system for thin film deposition, and more particularly to a system for depositing a thin film using a vapor deposition process.

2. Description of Related Art

During material processing, such as semiconductor device manufacturing for production of integrated circuits (ICs), vapor deposition is a common technique to form thin films, as well as to form conformal thin films over and within complex topography, on a substrate. Vapor deposition processes can include chemical vapor deposition (CVD) and plasma enhanced CVD (PECVD). For example, in semiconductor manufacturing, such vapor deposition processes may be used for gate dielectric film formation in front-end-of-line (FEOL) operations, and low dielectric constant (low-k) or ultra-low-k, porous or non-porous, dielectric film formation and barrier/seed layer formation for metallization in back-end-of-line (BEOL) operations, as well as capacitor dielectric film formation in DRAM production.

In a CVD process, a continuous stream of film precursor vapor is introduced to a process chamber containing a substrate, wherein the composition of the film precursor has the principal atomic or molecular species found in the film to be formed on the substrate. During this continuous process, the precursor vapor is chemisorbed on the surface of the substrate while it thermally decomposes and reacts with or without the presence of an additional gaseous component that assists the reduction of the chemisorbed material, thus, leaving behind the desired film.

In a PECVD process, the CVD process further includes plasma that is utilized to alter or enhance the film deposition mechanism. For instance, plasma excitation can allow film-forming reactions to proceed at temperatures that are significantly lower than those typically required to produce a similar film by thermally excited CVD. In addition, plasma excitation may activate film-forming chemical reactions that are not energetically or kinetically favored in thermal CVD.

Other CVD techniques include hot-filament CVD (otherwise known as hot-wire CVD or pyrolytic CVD). In hot-filament CVD, a film precursor is thermally decomposed by a resistively heated filament, and the resulting fragmented molecules adsorb and react on the surface of the substrate to leave the desired film. Unlike PECVD, hot-filament CVD does not require formation of plasma.

SUMMARY OF THE INVENTION

A system is provided for depositing a thin film using chemical vapor deposition (CVD).

Furthermore, a system is provided for depositing a thin film using pyrolytic CVD, whereby a resistive heating element is utilized to pyrolize a film forming composition.

According to one embodiment, a system for depositing a thin film on a substrate using a vapor deposition process is described. The deposition system includes a process chamber having a vacuum pumping system configured to evacuate the process chamber, a substrate holder coupled to the process chamber and configured to support the substrate, a gas distribution system coupled to the process chamber and configured to introduce a film forming composition to a process space in the vicinity of a surface of the substrate, a non-ionizing heat source separate from the substrate holder that is configured to receive a flow of the film forming composition and to cause thermal fragmentation of one or more constituents of the film forming composition when heated, and one or more power sources coupled to the heating element array and configured to provide an electrical signal to the at least one heating element zone. The deposition system further includes a remote source coupled to the process chamber and configured to supply a reactive composition to the process chamber to chemically interact with the substrate, wherein the remote source comprises a remote plasma generator, a remote radical generator, a remote ozone generator, or a water vapor generator, or a combination of two or more thereof.

DETAILED DESCRIPTION OF SEVERAL EMBODIMENTS

In the following description, in order to facilitate a thorough understanding and for purposes of explanation and not limitation, specific details are set forth, such as a particular geometry of the deposition system and descriptions of various components. However, it should be understood that the invention may be practiced in other embodiments that depart from these specific details.

Figure 1A:
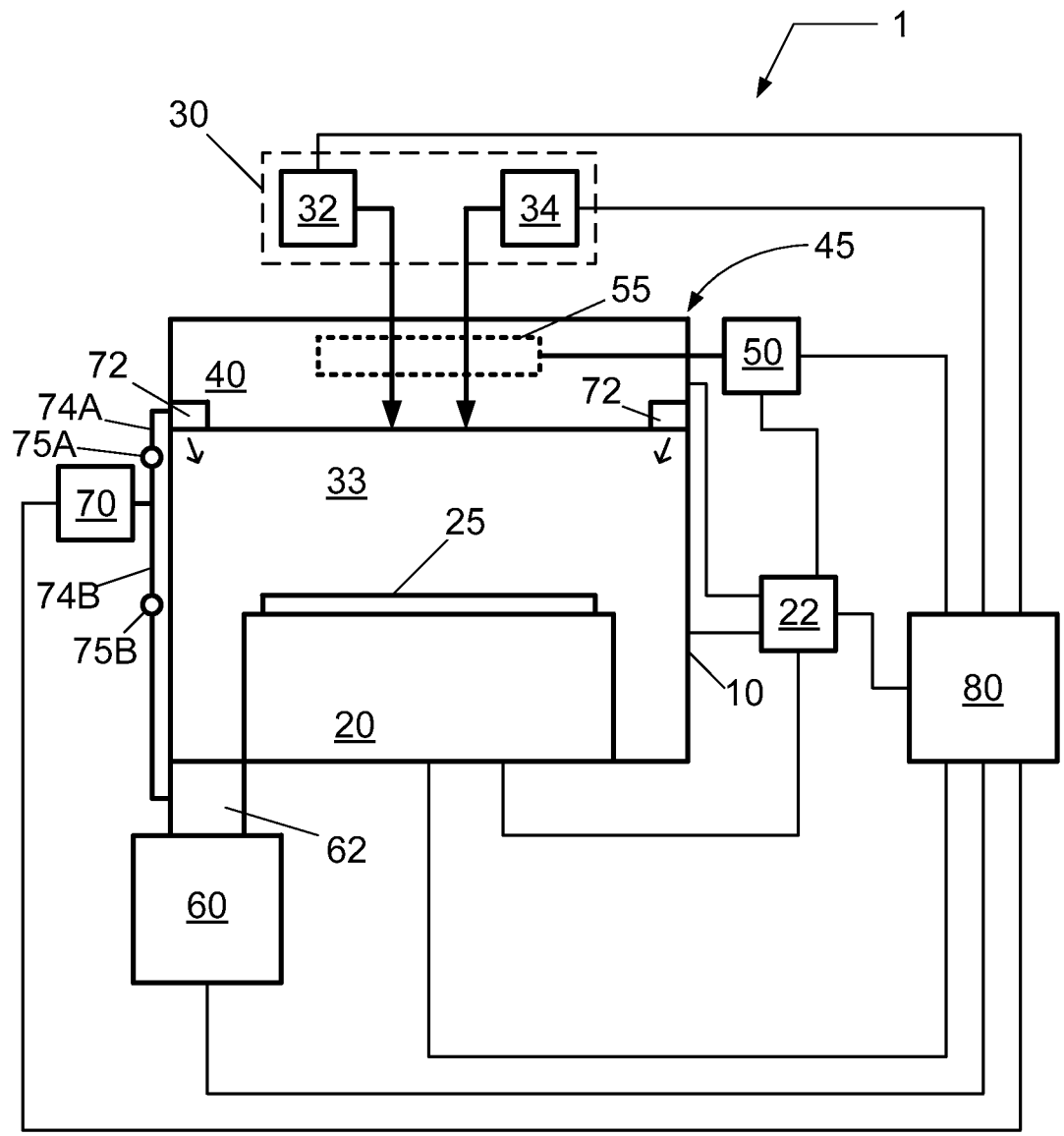
FIG. 1A depicts a schematic view of a deposition system according to an embodiment.
Figure 1B:
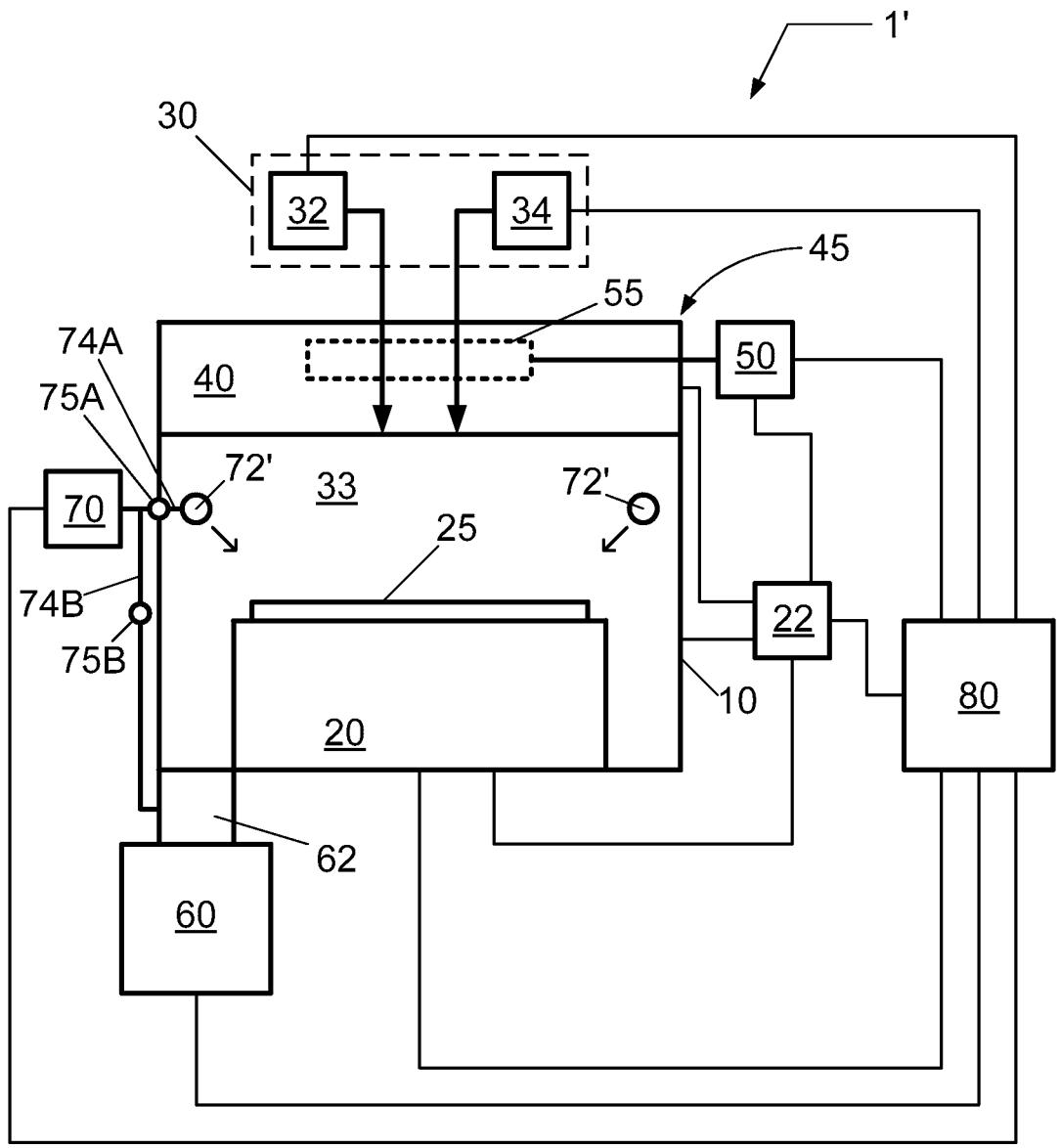
FIG. 1B depicts a schematic view of a deposition system according to another embodiment.

Referring now to the drawings, wherein like reference numerals designate identical or corresponding parts throughout the several views, FIGS. 1A and 1B schematically illustrate a deposition system (1, 1') for depositing a thin film, such as a conductive film, a non-conductive film, or a semi-conductive film. For example, the thin film can include a dielectric film, such as a low dielectric constant (low-k) or ultra-low-k dielectric film. Deposition system (1, 1') can include a chemical vapor deposition (CVD) system, whereby a film forming composition is thermally activated or decomposed in order to form a film on a substrate. For example, the deposition system (1, 1') comprises a pyrolytic CVD system.

The deposition system (1, 1') comprises a process chamber 10 having a substrate holder 20 configured to support a substrate 25, upon which the thin film is formed. Furthermore, the substrate holder is configured to control the temperature of the substrate at a temperature suitable for the film forming reactions.

The process chamber 10 is coupled to a film forming composition delivery system 30 configured to introduce a film forming composition to the process chamber 10 through a gas distribution system 40. Furthermore, a heat source 45 is coupled to the gas distribution system 40 and configured to chemically modify the film forming composition. The heat source 45 comprises one or more heating elements 55 disposed on an interior surface of the gas distribution system 40 or embedded within the gas distribution system 40 or both, and a power source 50 that is coupled to the one or more heating elements 55 and that is configured to deliver electrical power to the one or more heating elements 55. For example, the one or more heating elements 55 can comprise one or more resistive heating elements. When electrical current flows through and effects heating of the one or more resistive heating elements, the interaction of these heated elements with the film forming composition causes pyrolysis of one or more constituents of the film forming composition.

The process chamber 10 is further coupled to a vacuum pumping system 60 through a duct 62, wherein the vacuum pumping system 60 is configured to evacuate the process chamber 10 and the gas distribution system 40 to a pressure suitable for forming the thin film on the substrate 25 and suitable for pyrolysis of the film forming composition.

The film forming composition delivery system 30 can include one or more material sources configured to introduce a film forming composition to the gas distribution system 40. For example, the film forming composition may include one or more gases, or one or more vapors formed in one or more gases, or a mixture of two or more thereof. The film forming composition delivery system 30 can include one or more gas sources, or one or more vaporization sources, or a combination thereof. Herein vaporization refers to the transformation of a material (normally stored in a state other than a gaseous state) from a non-gaseous state to a gaseous state. Therefore, the terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas.

When the film forming composition is introduced to the gas distribution system 40, one or more constituents of the film forming composition are subjected to pyrolysis by the heat source 45 described above. The film forming composition can include film precursors that may or may not be fragmented by pyrolysis in the gas distribution system 40. The film precursor or precursors may include the principal atomic or molecular species of the film desired to be produced on the substrate. Additionally, the film forming composition can include a reducing agent that may or may not be fragmented by pyrolysis in the gas distribution system 40. The reducing agent or agents may assist with the reduction of a film precursor on substrate 25. For instance, the reducing agent or agents may react with a part of or all of the film precursor on substrate 25. Additionally yet, the film forming composition can include a polymerizing agent that may or may not be fragmented by pyrolysis in the gas distribution system 40. The polymerizing agent may assist with the polymerization of a film precursor or fragmented film precursor on substrate 25.

According to one example, when forming a copolymer thin film on substrate 25, a film forming composition comprising two or more monomer gases is introduced to the gas distribution system 40 and is exposed to the heat source 45, i.e., the one or more heating elements 55, having a temperature sufficient to pyrolyze one or more of the monomers and produce a source of reactive species. These reactive species are introduced to and distributed within process space 33 in the vicinity of the upper surface of substrate 25. Substrate 25 is maintained at a temperature lower than that of the heat source 45 in order to condensate and induce polymerization of the chemically altered film forming composition at the upper surface of substrate 25. As another example, when forming a fluorocarbon-organosilicon copolymer, monomer gases of a fluorocarbon precursor and organosilicon precursor are used.

Further yet, the film forming composition can include an initiator that may or may not be fragmented by pyrolysis in the gas distribution system 40. An initiator or fragmented initiator may assist with the fragmentation of a film precursor, or the polymerization of a film precursor. The use of an initiator can permit higher deposition rates at lower heat source temperatures. For instance, the one or more heating elements can be used to fragment the initiator to produce radical species of the initiator (i.e., a fragmented initiator) that are reactive with one or more of the remaining constituents in the film forming composition. Furthermore, for instance, the fragmented initiator or initiator radicals can catalyze the formation of radicals of the film forming composition. For example, when forming a fluorocarbon-organosilicon copolymer, the initiator can be perfluorooctane sulfonyl fluoride (PFOSF) used in the polymerization of a cyclic vinylmethylsiloxane, such as 1,3,5-trivinyl-1,3,5-trimethylcyclotrisiloxane ($V_3D_3$).

According to one embodiment, the film forming composition delivery system 30 can include a first material source 32 configured to introduce one or more film precursors to the gas distribution system 40, and a second material source 34 configured to introduce a (chemical) initiator to the gas distribution system 40. Furthermore, the film forming composition delivery system 30 can include additional gas sources configured to introduce an inert gas, a carrier gas or a dilution gas. For example, the inert gas, carrier gas or dilution gas can include a noble gas, i.e., He, Ne, Ar, Kr, Xe, or Rn.

Figure 2A:
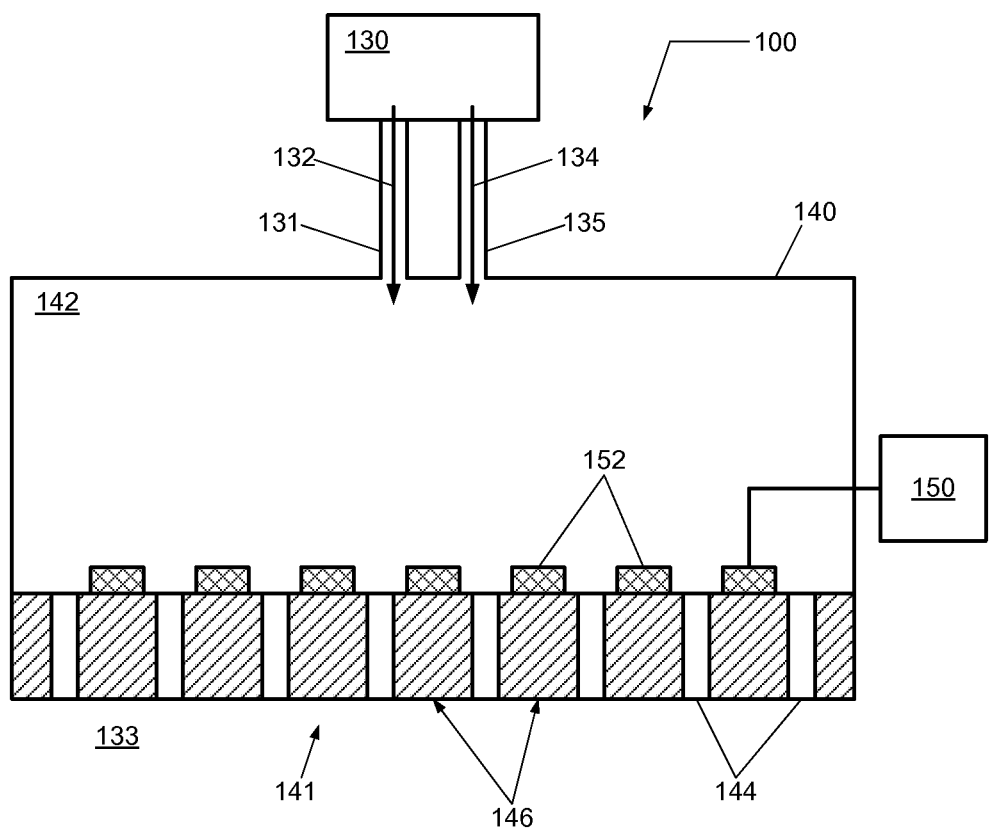
FIG. 2A depicts a gas distribution system according to an embodiment.

Referring now to FIG. 2A, a gas distribution system 100 is illustrated according to an embodiment. The gas distribution system 100 comprises a housing 140 configured to be coupled to or within a process chamber of a deposition system (such as process chamber 10 of deposition system (1, 1') in FIGS. 1A and 1B), and a gas distribution plate 141 configured to be coupled to the housing 140, wherein the combination form a plenum 142. The gas distribution system 100 may be thermally insulated from the process chamber, or it may not be thermally insulated from the process chamber. The gas distribution system 100 is configured to receive and provide a film forming composition into the plenum 142 from a film forming composition delivery system 130 and distribute the film forming composition in a process space 133 of the process chamber. For example, the gas distribution system 100 can be coupled to the film forming composition delivery system 130 using a first gas supply line 131 configured to provide one or more constituents of a film forming composition 132 and a second supply line 135 configured to provide an optional initiator 134 into plenum 142 from the film forming composition delivery system 130. The one or more constituents of the film forming composition 132 and the optional initiator 134 may be introduced to plenum 142 separately as shown, or they may be introduced through the same supply line. The gas distribution plate 141 comprises a plurality of openings 144 (e.g., flow channels or conduits) arranged to introduce and distribute the film forming composition from plenum 142 to the process space 133 proximate a substrate (not shown) upon which a film is to be formed. For example, gas distribution plate 141 comprises a lower surface 146 configured to face the upper surface of a substrate. The plurality of openings 144 may include one or more orifices, one or more nozzles, or one or more slots, or a combination thereof.

Furthermore, the gas distribution system 100 comprises a heat source having one or more heating elements 152 coupled to a power source 150. The one or more heating elements 152 are disposed on at least one interior surface of the gas distribution system 100, such that they may interact with any constituent of the film forming composition, or all of the constituents of the film forming composition including the optional initiator. For example, the one or more heating elements 152 may be formed on an upper surface of the gas distribution plate 141. Additionally, for example, the one or more heating elements 152 can comprise one or more resistive heating elements. When the power source 150 couples electrical power to the one or more heating elements 152, the one or more heating elements 152 may be elevated to a temperature sufficient to pyrolize one or more constituents of the film forming composition. Power source 150 may include a direct current (DC) power source, or it may include an alternating current (AC) power source.

Figure 2B:
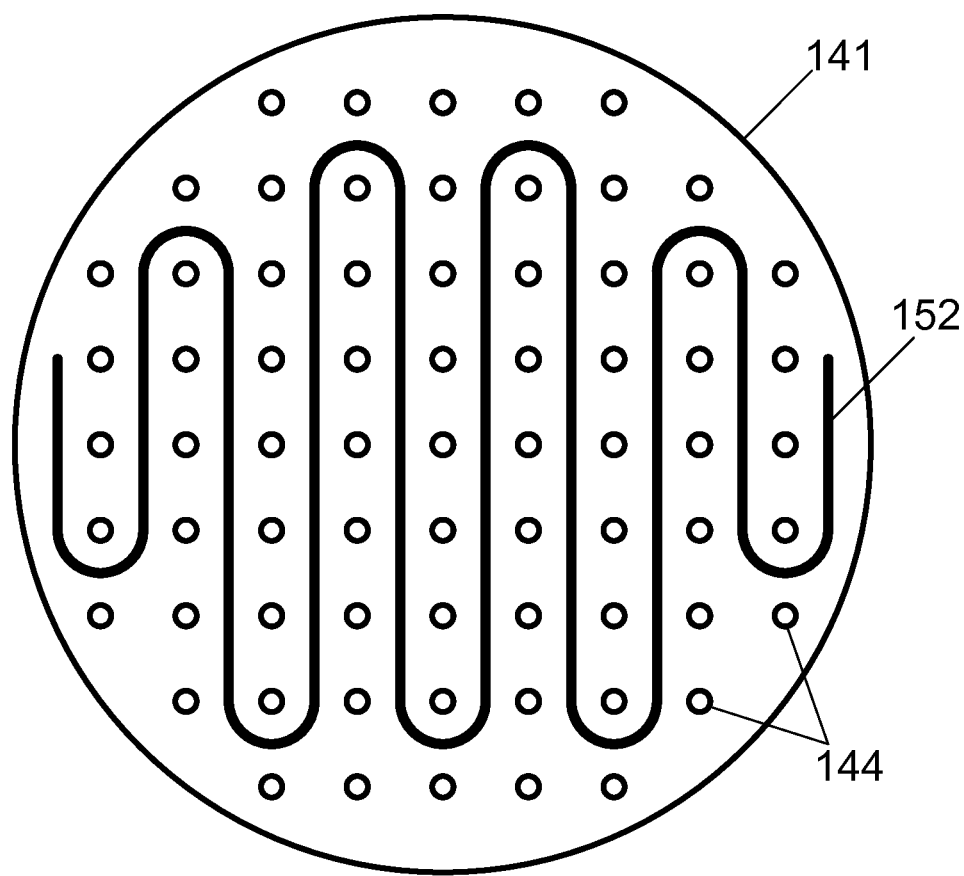
FIG. 2B depicts a top view of a gas distribution plate according to another embodiment.
Figure 2C:
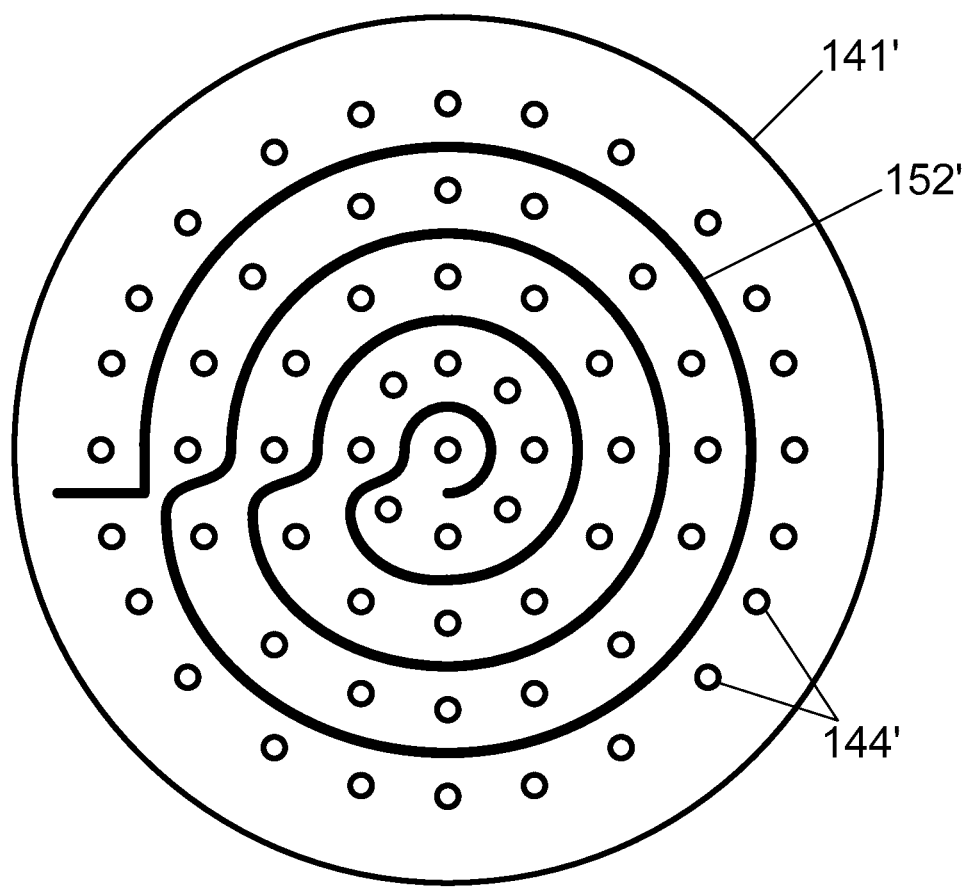
FIG. 2C depicts a top view of a gas distribution plate according to another embodiment.

The one or more openings 144 formed in gas distribution plate 141 can include one or more orifices or one or more slots or a combination thereof. The one or more openings 144 can include a plurality of orifices distributed on the gas distribution plate 141 in a rectilinear pattern. Alternatively, the one or more openings 144 can include a plurality of orifices distributed on the gas distribution plate 141 in a circular pattern (e.g., orifices are distributed in a radial direction or angular direction or both). When the one or more heating elements 152 are disposed on the upper surface of the gas distribution plate 141, each heating element can be positioned such that it does not overlap with an opening, or it can be positioned such that it does overlap with an opening and the opening is formed there through. For example, a rectilinear distribution of openings 144 may be used while each heating element 152 takes a serpentine-like path on gas distribution plate 141 as illustrated in FIG. 2B. Alternatively, for example, a circular distribution of openings 144' may be used while each heating element 152' takes a spiral-like path on gas distribution plate 141' as illustrated in FIG. 2C.

Additionally, the plurality of openings 144 can be distributed in various density patterns on the gas distribution plate 141. For example, more openings can be formed near the center of the gas distribution plate 141 and fewer openings can be formed near the periphery of the gas distribution plate 141. Alternatively, for example, more openings can be formed near the periphery of the gas distribution plate 141 and fewer openings can be formed near the center of the gas distribution plate 141. Additionally yet, the size of the openings can vary on the gas distribution plate 141. For example, larger openings can be formed near the center of the gas distribution plate 141 and smaller openings can be formed near the periphery of the gas distribution plate 141. Alternatively, for example, smaller openings can be formed near the periphery of the gas distribution plate 141 and larger openings can be formed near the center of the gas distribution plate 141.

Figure 2D:
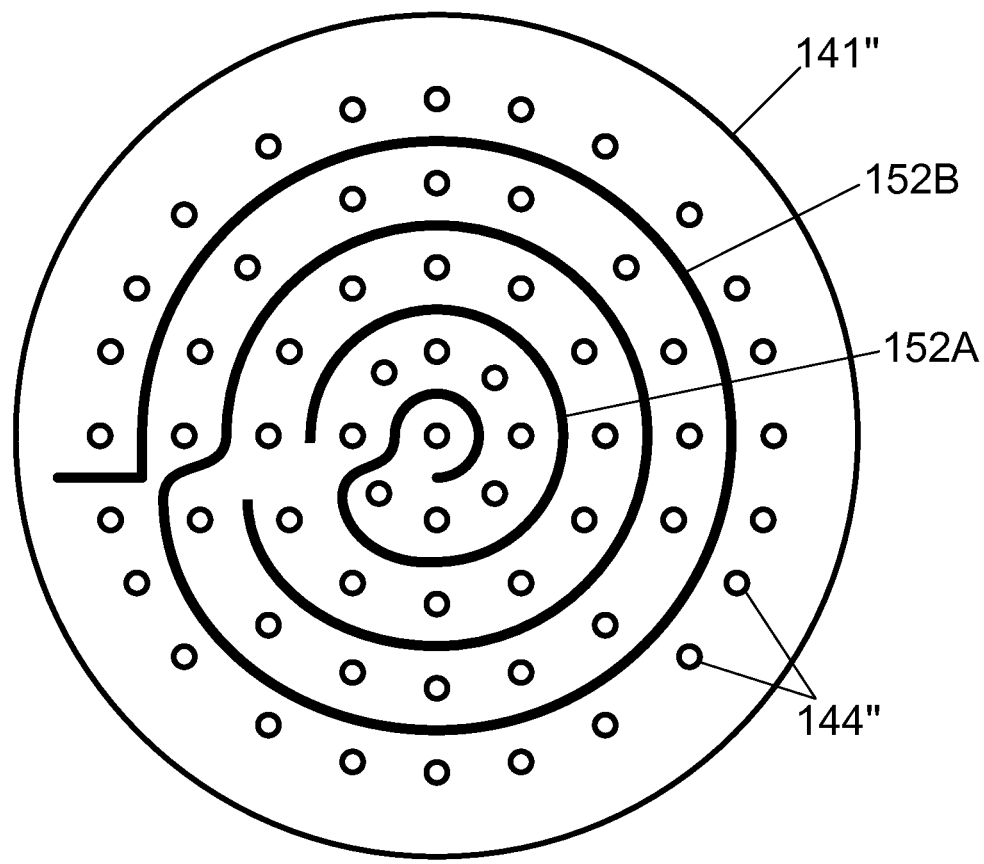
FIG. 2D depicts a top view of a gas distribution plate according to another embodiment.

As illustrated in FIG. 2D, the one or more heating elements comprise a plurality of heating elements. For example, the plurality of heating elements include an inner heating element 152A and an outer heating element 152B coupled to a surface of a gas distribution plate 141" having a plurality of openings 144". In this example, the inner heating element 152A and the outer heating element 152B are concentric. However, the arrangement of the heating elements on the interior of the gas distribution system can be arbitrary and tailored for optimum process results. Power from a power source (not shown) may be coupled to the plurality of heating elements in series or in parallel or a combination thereof.

As described above, the one or more heating elements 152 are disposed on at least one interior surface of the gas distribution system 100, such that they may interact with any constituent of the film forming composition, or all of the constituents of the film forming composition including the optional initiator. An interior surface on the gas distribution system 100 can include any surface on the gas distribution system 100. As shown in FIG. 2A, an interior surface can include the upper surface of gas distribution plate 141. However, the interior surface can further include a surface on housing 140 or within plenum 142 that interacts with the film forming composition, or an internal surface of the inlet lines that provide the film forming composition 132 and the optional initiator 134 into plenum 142. Additionally, the one or more heating elements can be formed within any component of the gas distribution system 100 including, for example, the housing 140 and the gas distribution plate 141.

Figure 2E:
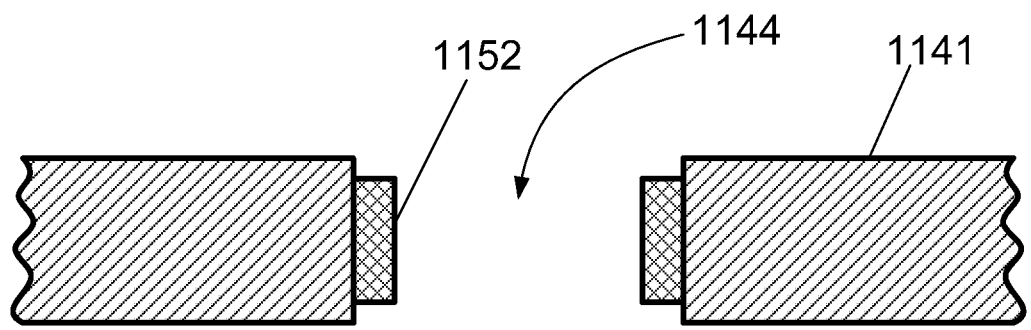
FIG. 2E depicts an exploded view of an opening in a member of a gas distribution system according to another embodiment.
Figure 2F:
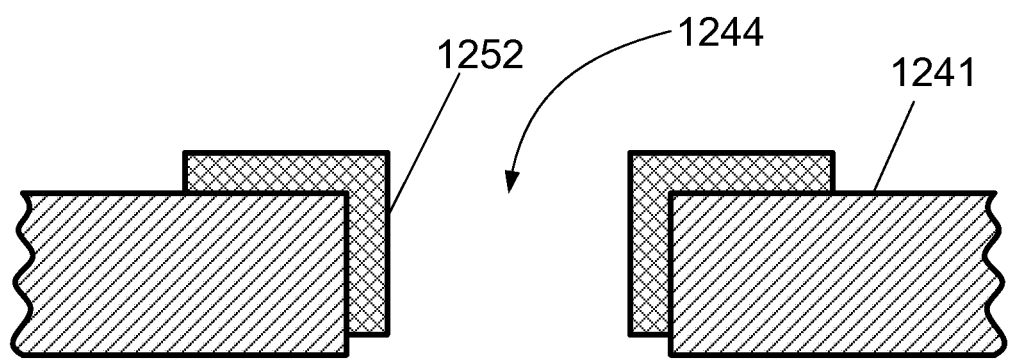
FIG. 2F depicts an exploded view of an opening in a member of a gas distribution system according to yet another embodiment.

Furthermore, as illustrated in FIGS. 2E and 2F, the one or more heating elements can be coupled to a surface of the plurality of openings formed in gas distribution plate. For example, as illustrated in FIG. 2E, a heating element 1152 can be disposed on a surface of an opening 1144 formed in gas distribution plate 1141. Alternatively, for example, as illustrated in FIG. 2F, a heating element 1252 can be partially disposed on a surface of an opening 1244 formed in gas distribution plate 1241, as well as partially on an upper surface of gas distribution plate 1241 and/or a lower surface of gas distribution plate 1241 (not shown).

Figure 3:
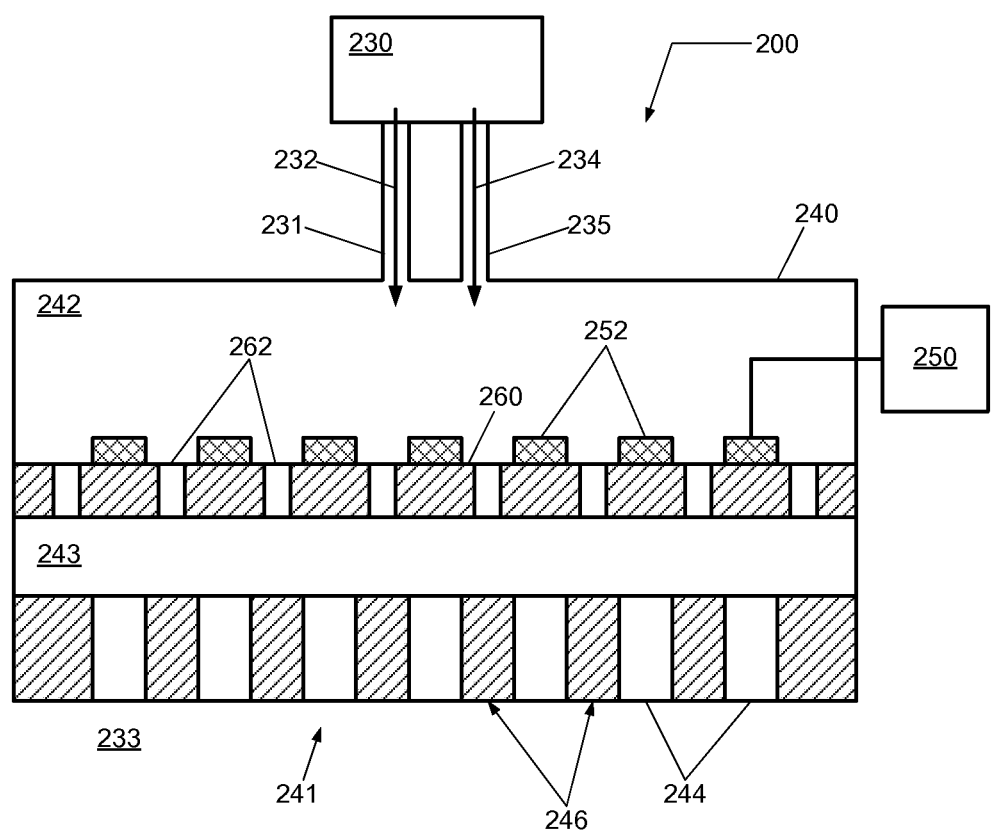
FIG. 3 depicts a gas distribution system according to another embodiment.

Referring now to FIG. 3, a gas distribution system 200 is illustrated according to another embodiment. The gas distribution system 200 comprises a housing 240 configured to be coupled to or within a process chamber of a deposition system (such as process chamber 10 of deposition system (1, 1') in FIGS. 1A and 1B), and a gas distribution plate 241 configured to be coupled to the housing 240. The gas distribution system 200 may be thermally insulated from the process chamber, or it may not be thermally insulated from the process chamber. Additionally, gas distribution system 200 comprises an intermediate gas distribution plate 260 coupled to housing 240 such that the combination of housing 240, intermediate gas distribution plate 260 and gas distribution plate 241 form a first plenum 242 above intermediate gas distribution plate 260 and an intermediate plenum 243 between the intermediate gas distribution plate 260 and the gas distribution plate 241, as shown in FIG. 3. The gas distribution system 200 is configured to receive and provide a film forming composition into the first plenum 242 from a film forming composition delivery system 230 and distribute the film forming composition in a process space 233 of the process chamber. For example, the gas distribution system 200 can be coupled to the film forming composition delivery system 230 using a first gas supply line 231 configured to provide one or more constituents of a film forming composition 232 and a second supply line 235 configured to provide an optional initiator 234 into first plenum 242 from the film forming composition delivery system 230. The one or more constituents of the film forming composition 232 and the optional initiator 234 may be introduced to first plenum 242 separately as shown, or they may be introduced through the same supply line.

Furthermore, the gas distribution system 200 comprises a heat source having one or more heating elements 252 coupled to a power source 250. The one or more heating elements 252 are disposed on at least one interior surface of the gas distribution system 200, such that they may interact with any constituent of the film forming composition or the optional initiator or both. For example, the one or more heating elements 252 may be formed on an upper surface of the intermediate gas distribution plate 260. The one or more heating elements 252 may be formed in a serpentine-like path, or a spiral-like path, or any arbitrary shape. Additionally, for example, the one or more heating elements 252 can comprise one or more resistive heating elements. When the power source 250 couples electrical power to the one or more heating elements 252, the one or more heating elements 252 may be elevated to a temperature sufficient to pyrolize one or more constituents of the film forming composition. Power source 250 may include a direct current (DC) power source, or it may include an alternating current (AC) power source.

The intermediate gas distribution plate 260 comprises a plurality of intermediate openings 262 arranged to distribute and introduce the film forming composition to the intermediate plenum 243. Additionally, the gas distribution plate 241 comprises a plurality of openings 244 arranged to introduce and distribute the film forming composition from the intermediate plenum 243 to the process space 233 proximate a substrate (not shown) upon which a film is to be formed. For example, gas distribution plate 241 comprises a lower surface 246 configured to face the upper surface of a substrate. The intermediate openings 262 in intermediate gas distribution plate 260 may or may not be aligned with the openings 244 in gas distribution plate 241.

Although the film forming composition is shown in FIG. 3 to be introduced to the first plenum 242, any constituent of the film forming composition may be introduced directly to the intermediate plenum 243 in order to avoid or reduce interaction with the one or more heating elements 252 disposed in first plenum 242. For example, the initiator may be introduced to first plenum 242 in order to interact with the one or more heating elements 252 and undergo pyrolysis, while the remaining constituents of the film forming composition can be introduced to the intermediate plenum 243.

The one or more openings 244 formed in gas distribution plate 241 and the plurality of intermediate openings 262 formed in the intermediate gas distribution plate 260 can be arranged, distributed or sized as described above. When the one or more heating elements 252 are disposed on the upper surface of the intermediate gas distribution plate 260, each heating element can be positioned such that it does not overlap with an opening, or it can be positioned such that it does overlap with an opening and the opening is formed there through.

As described above, the one or more heating elements 252 are disposed on at least one interior surface of the gas distribution system 200, such that they may interact with any constituent of the film forming composition, or all of the constituents of the film forming composition including the optional initiator. An interior surface on the gas distribution system 200 can include any surface on the gas distribution system 200. As shown in FIG. 3, an interior surface can include the upper surface of intermediate gas distribution plate 260. However, the interior surface can further include a surface on housing 240 or within first plenum 242 that interacts with the film forming composition, or a surface within intermediate plenum 243 that interacts with the film forming composition, or an internal surface of the inlet lines that provide the film forming composition 232 and the optional initiator 234 into first plenum 242. Additionally, the interior surface can include the lower surface of intermediate gas distribution plate 260, a surface of the plurality of intermediate openings 262 formed in intermediate gas distribution plate 260, the upper surface of the gas distribution plate 241, the lower surface of the gas distribution plate 241, or a surface of the plurality of openings 244 formed in gas distribution plate 241, or a combination of two or more thereof. Furthermore, the one or more heating elements can be formed within any component of the gas distribution system 200 including, for example, the housing 240, the gas distribution plate 241 and the intermediate gas distribution plate 260.

Figure 4A:
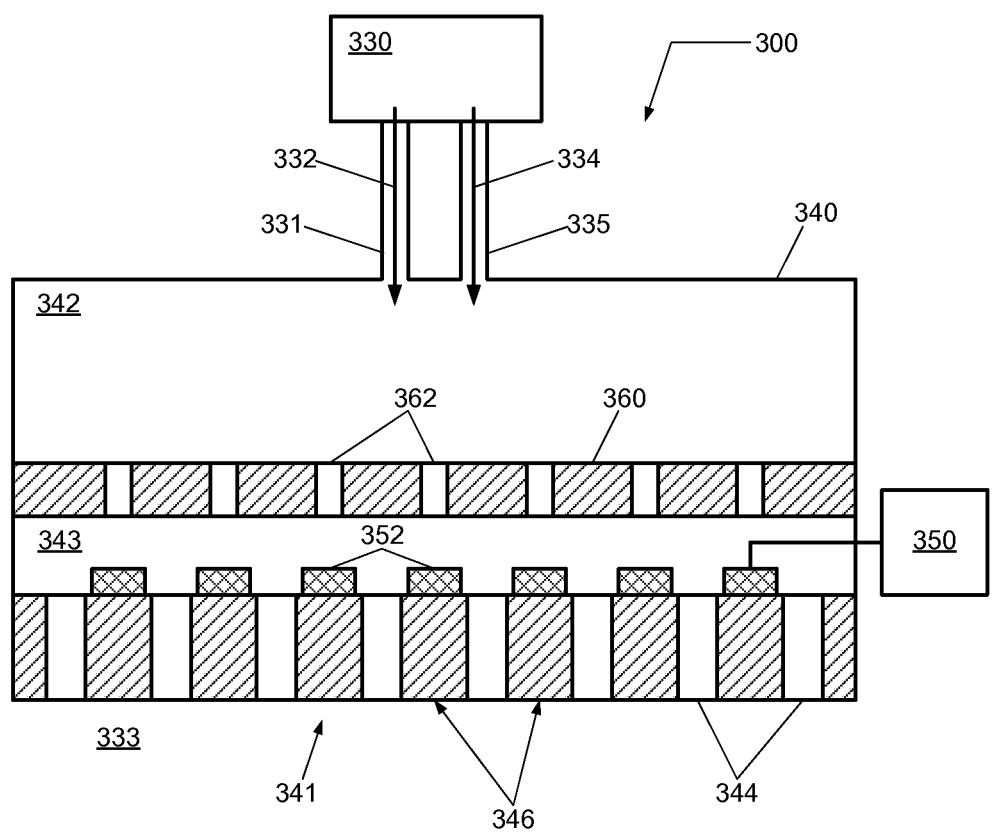
FIG. 4A depicts a gas distribution system according to another embodiment.

Referring now to FIG. 4A, a gas distribution system 300 is illustrated according to another embodiment. The gas distribution system 300 comprises a housing 340 configured to be coupled to or within a process chamber of a deposition system (such as process chamber 10 of deposition system (1, 1') in FIGS. 1A and 1B), and a gas distribution plate 341 configured to be coupled to the housing 340. The gas distribution system 300 may be thermally insulated from the process chamber, or it may not be thermally insulated from the process chamber. Additionally, gas distribution system 300 comprises an intermediate gas distribution plate 360 coupled to housing 340 such that the combination of housing 340, intermediate gas distribution plate 360 and gas distribution plate 341 form a first plenum 342 above intermediate gas distribution plate 360 and an intermediate plenum 343 between the intermediate gas distribution plate 360 and the gas distribution plate 341, as shown in FIG. 4A. The gas distribution system 300 is configured to receive and provide a film forming composition into the first plenum 342 from a film forming composition delivery system 330 and distribute the film forming composition in a process space 333 of the process chamber. For example, the gas distribution system 300 can be can be coupled to the film forming composition delivery system 330 using a first gas supply line 331 configured to provide one or more constituents of a film forming composition 332 and a second supply line 335 configured to provide an optional initiator 334 into first plenum 342 from the film forming composition delivery system 330. The one or more constituents 332 of the film forming composition and the optional initiator 334 may be introduced to first plenum 342 separately as shown, or they may be introduced through the same supply line.

Furthermore, the gas distribution system 300 comprises a heat source having one or more heating elements 352 coupled to a power source 350. The one or more heating elements 352 are disposed on at least one interior surface of the gas distribution system 300, such that they may interact with the film forming composition. For example, the one or more heating elements 352 may be formed on an upper surface of the gas distribution plate 341. The one or more heating elements 352 may be formed in a serpentine-like path, or a spiral-like path, or any arbitrary shape. Additionally, for example, the one or more heating elements 352 can comprise one or more resistive heating elements. When the power source 350 couples electrical power to the one or more heating elements 352, the one or more heating elements 352 may be elevated to a temperature sufficient to pyrolize one or more constituents of the film forming composition. Power source 350 may include a direct current (DC) power source, or it may include an alternating current (AC) power source.

The intermediate gas distribution plate 360 comprises a plurality of intermediate openings 362 arranged to distribute and introduce the film forming composition to the intermediate plenum 343. Additionally, the gas distribution plate 341 comprises a plurality of openings 344 arranged to introduce and distribute the film forming composition from the intermediate plenum 343 to the process space 333 proximate a substrate (not shown) upon which a film is to be formed. For example, gas distribution plate 341 comprises a lower surface 346 configured to face the upper surface of a substrate. The intermediate openings 362 in intermediate gas distribution plate 360 may be arranged such that the flow of the film forming composition to intermediate plenum 343 impinges upon the one or more heating elements 352 as shown in FIG. 4A.

The plurality of openings 344 formed in gas distribution plate 341 and the plurality of intermediate openings 362 formed in the intermediate gas distribution plate 360 can be arranged, distributed or sized as described above. When the one or more heating elements 352 are disposed on the upper surface of the gas distribution plate 341, each heating element can be positioned such that it does not overlap with an opening, or it can be positioned such that it does overlap with an opening and the opening is formed there through.

Figure 4B:
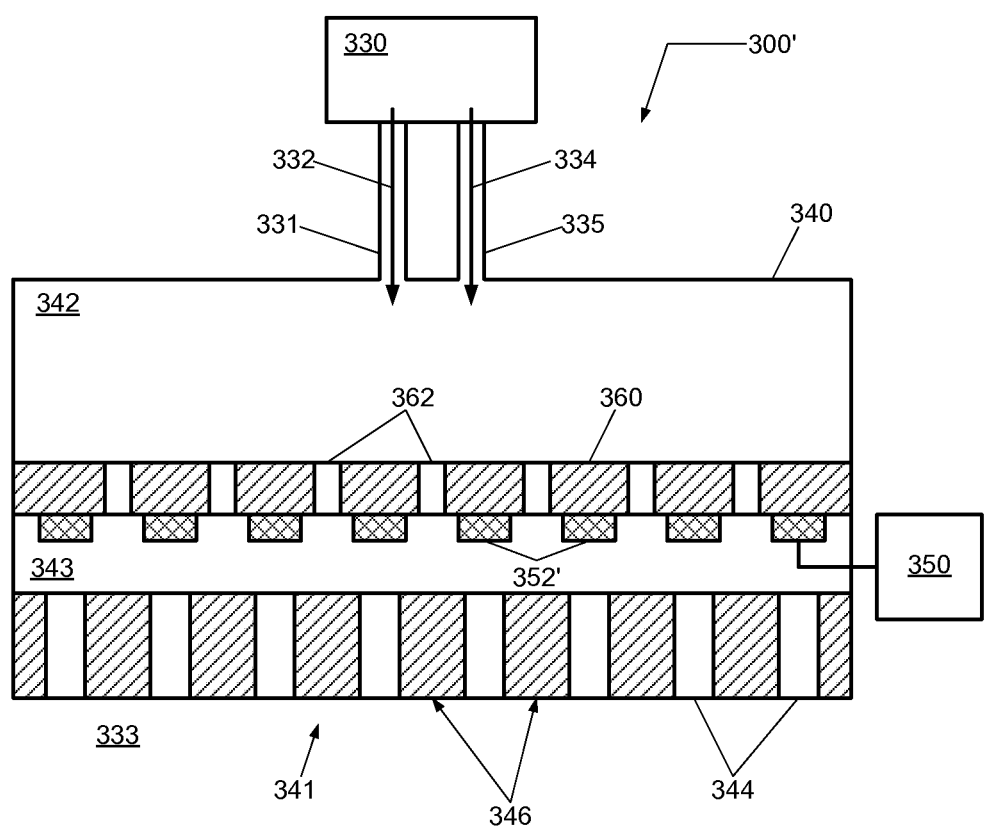
FIG. 4B depicts a gas distribution system according to another embodiment.

As described above, the one or more heating elements 352 are disposed on at least one interior surface of the gas distribution system 300, such that they may interact with any constituent of the film forming composition, or all of the constituents of the film forming composition including the optional initiator. An interior surface on the gas distribution system 300 can include any surface on the gas distribution system 300. As shown in FIG. 4A, an interior surface can include the upper surface of gas distribution plate 341. However, as illustrated in FIG. 4B, a gas distribution system 300' can comprise one or more heating elements 352' coupled to the lower surface of the intermediate gas distribution plate 360. Additionally, the interior surface can include a surface of the plurality of intermediate openings 362 formed in intermediate gas distribution plate 360, the upper surface of the gas distribution plate 341, the lower surface of the gas distribution plate 341, or a surface of the plurality of openings 344 formed in gas distribution plate 341, or a combination of two or more thereof. Furthermore, the one or more heating elements can be formed within any component of the gas distribution system 300 including, for example, the housing 340, the gas distribution plate 341 and the intermediate gas distribution plate 360.

Figure 5:
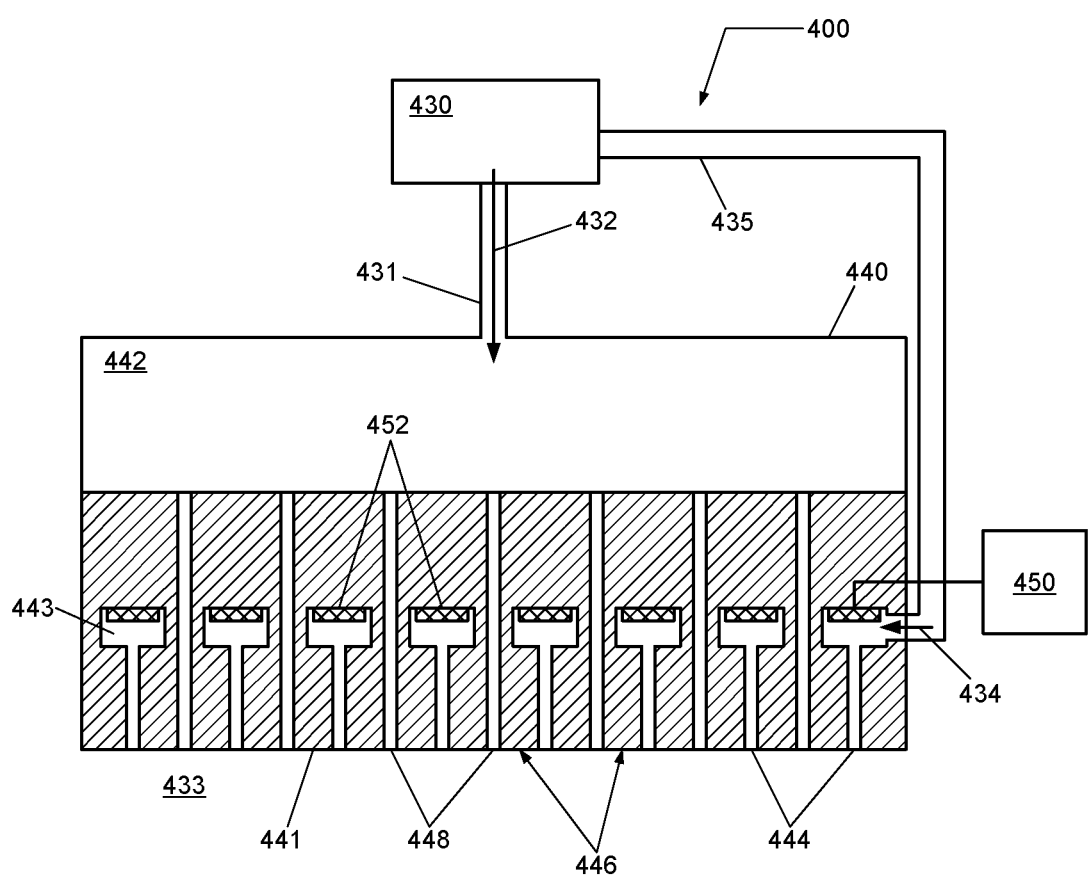
FIG. 5 depicts a gas distribution system according to another embodiment.

Referring now to FIG. 5, a gas distribution system 400 is illustrated according to another embodiment. The gas distribution system 400 comprises a housing 440 configured to be coupled to or within a process chamber of a deposition system (such as process chamber 10 of deposition system (1, 1') in FIGS. 1A and 1B), and a multi-component gas distribution plate 441 configured to be coupled to the housing 440. The gas distribution system 400 may be thermally insulated from the process chamber, or it may not be thermally insulated from the process chamber. The multi-component gas distribution plate 441 can be coupled to a film forming composition delivery system 430 using a first supply line 431 configured to independently couple a first composition 432 to a first plenum 442 and distribute the first composition 432 through a first array of openings 448 to a process space 433, and a second supply line 435 configured to independently couple a second composition 434 to a second plenum 443 and distribute the second composition 434 through a second array of openings 444 to the process space 433 without mixing the first composition 432 and the second composition 434 prior to the process space 433. The first array of openings 448 and the second array of openings 444 can be arranged, distributed or sized as described above.

Figure 6:
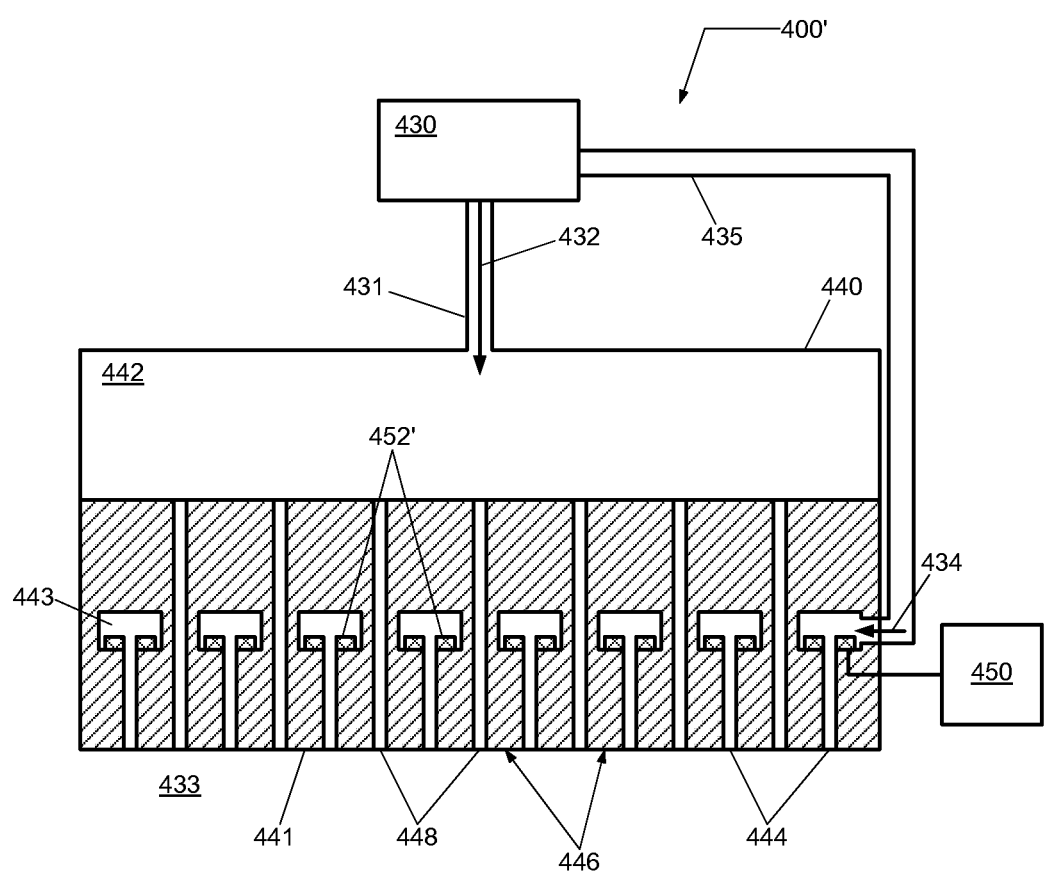
FIG. 6 depicts a gas distribution system according to another embodiment.

Furthermore, the gas distribution system 400 comprises a heat source having one or more heating elements 452 coupled to a power source 450. The one or more heating elements 452 are disposed on at least one interior surface of the gas distribution system 400, such that they may interact with the second composition 434 in the second plenum 443. For example, as illustrated in FIG. 5, the one or more heating elements 452 may be formed on an upper surface of the second plenum 443. The one or more heating elements 452 may be formed in a serpentine-like path, or a spiral-like path, or any arbitrary shape. Alternatively, for example, as illustrated in FIG. 6 in gas distribution system 400', the one or more heating elements 452' may be formed on a lower surface of the second plenum 443 surrounding the second array of openings 444. The one or more heating elements 452' may be formed in a serpentine-like path, or a spiral-like path, or any arbitrary shape, and the one or more openings may be formed there through. Additionally, for example, the one or more heating elements 452, 452' can comprise one or more resistive heating elements. When the power source 450 couples electrical power to the one or more heating elements 452, the one or more heating elements 452 may be elevated to a temperature sufficient to pyrolize one or more constituents of the second composition 434. Power source 450 may include a direct current (DC) power source, or it may include an alternating current (AC) power source.

The first composition 432 can include one or more constituents of the film forming composition wherein interaction with the heat generated by power source 450 is not desired. Additionally, the second composition 434 can include one or more constituents of the film forming composition wherein interaction with the heat generated by power source 450 is desired. For example, the first composition 432 can include one or more film forming gases and the second composition 434 can include an initiator. While the one or more film forming gases are introduced to process space 433, the initiator undergoes pyrolysis prior to introduction to process space 433. Once the one or more film forming gases and the initiator radicals interact in process space 433, the initiator radicals can catalyze the dissociation of at least one constituent of the one or more film forming gases.

As described above, the one or more heating elements 452, 452' are disposed on at least one interior surface of the gas distribution system 400, 400', such that they may interact with any constituent of the film forming composition, or all of the constituents of the film forming composition including the optional initiator. An interior surface on the gas distribution system 400, 400' can include any surface on the gas distribution system 400, 400'. As shown in FIG. 5, an interior surface can include the upper surface of the second plenum 443. As shown in FIG. 6, an interior surface can include the lower surface of the second plenum 443. However, the interior surface can further include a surface on housing 440 or within first plenum 442 that interacts with the first composition 432, or any surface within second plenum 443 that interacts with the second composition 434, or an internal surface of the inlet lines that provide the first composition 432 and the second composition 434 into first plenum 442 and second plenum 443. Additionally, the interior surface can include the upper surface of multi-component gas distribution plate 441, a surface of the first array of openings 448, a surface of the second array of openings 444, or the lower surface of the multi-component gas distribution plate 441, or a combination of two or more thereof. Furthermore, the one or more heating elements can be formed within any component of the gas distribution system 400, 400' including, for example, the housing 440 and the multi-component gas distribution plate 441.

Figure 9:
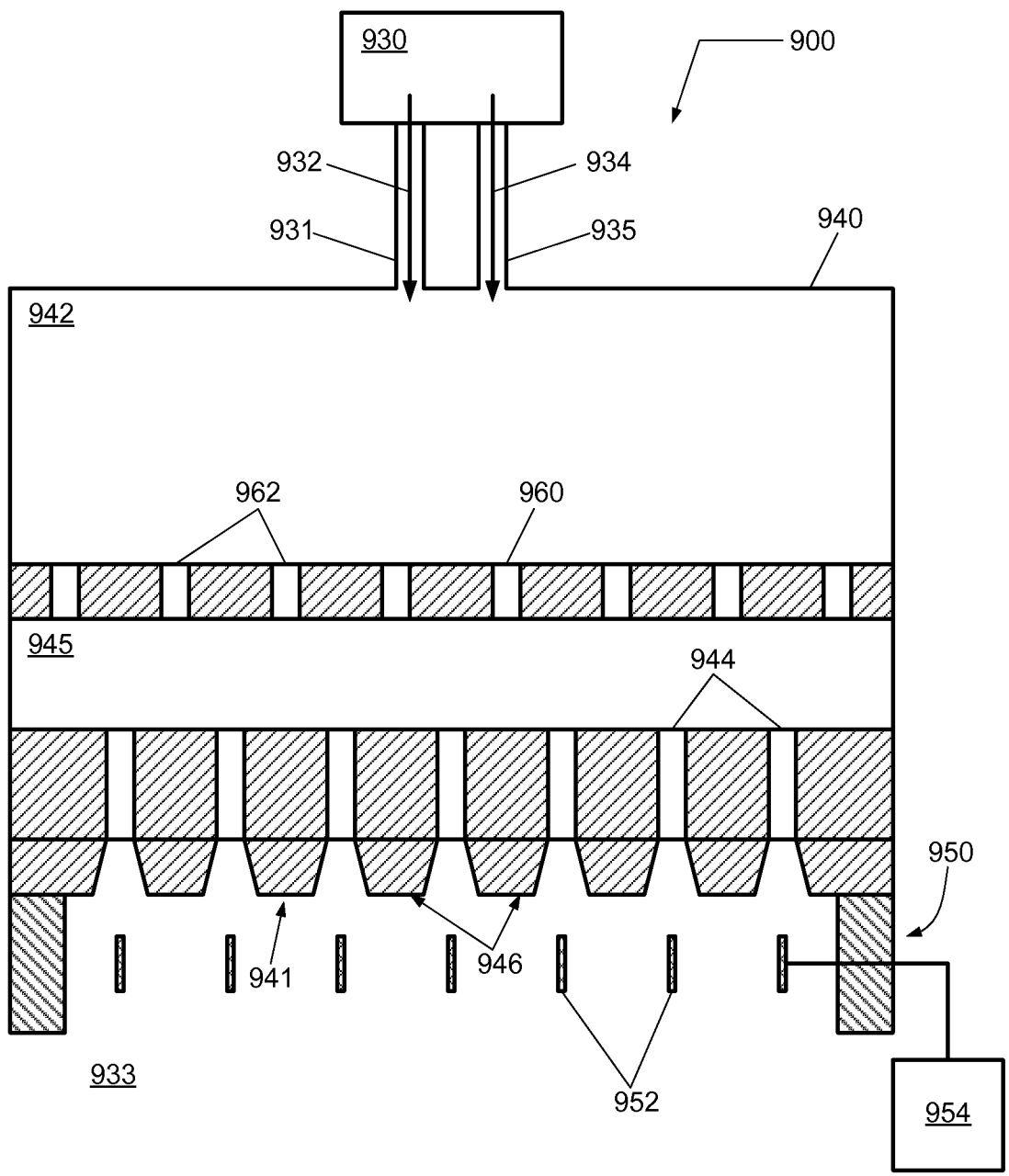
FIG. 9 provides a schematic cross-sectional view of a gas distribution system according to an embodiment.

Referring now to FIG. 9, a gas distribution system 900 is illustrated according to an embodiment. The gas distribution system 900 comprises a housing 940 configured to be coupled to or within a process chamber of a deposition system (such as process chamber 10 of deposition system (1, 1') in FIGS. 1A and 1B), and a gas distribution plate 941 configured to be coupled to the housing 940, wherein the combination form a plenum 942. The gas distribution system 900 may be thermally insulated from the process chamber, or it may not be thermally insulated from the process chamber.

The gas distribution system 900 is configured to receive and provide a film forming composition or process gas into the plenum 942 from a film forming composition delivery system 930 and distribute the film forming composition in a process space 933 of the process chamber. For example, the gas distribution system 900 can be coupled to the film forming composition delivery system 930 using a first supply line 931 configured to provide one or more constituents of a film forming composition 932, such as a chemical precursor, and a second supply line 935 configured to provide an optional inert gas 934 into plenum 942 from the film forming composition delivery system 930. The one or more constituents of the film forming composition 932 and the optional inert gas 934 may be introduced to plenum 942 separately as shown, or they may be introduced through the same supply line.

The gas distribution plate 941 comprises a plurality of openings 944 arranged to introduce and distribute the film forming composition from plenum 942 to the process space 933 proximate a substrate (not shown) upon which a film is to be formed. For example, gas distribution plate 941 comprises an outlet 946 configured to face the upper surface of a substrate. Furthermore, for example, the gas distribution plate 941 may include gas showerhead.

Furthermore, the gas distribution system 900 comprises a gas heating device 950 having one or more heating elements 952 coupled to a power source 954 and configured to receive an electrical current from the power source 954. The one or more heating elements 952 are located at the outlet 946 of the gas distribution system 900, such that they may interact with any constituent of the film forming composition, or all of the constituents of the film forming composition.

For example, the one or more heating elements 952 can comprise one or more resistive heating elements. Additionally, for example, the one or more heating elements 952 may include a metal-containing ribbon or a metal-containing wire. Furthermore, for example, the one or more heating elements 952 can be composed of a resistive metal, a resistive metal alloy, a resistive metal nitride, or a combination of two or more thereof.

When the power source 954 couples electrical power to the one or more heating elements 952, the one or more heating elements 952 may be elevated to a temperature sufficient to pyrolize one or more constituents of the film forming composition. Power source 954 may include a direct current (DC) power source, or it may include an alternating current (AC) power source. Power source 954 may be configured to couple electrical power to the one or more heating elements 952 through a direct electrical connection to the one or more heating elements 952. Alternatively, power source 954 may be configured to couple electrical power to the one or more heating elements 952 through induction.

The one or more openings 944 formed in gas distribution plate 941 can include one or more orifices, one or more nozzles, or one or more slots, or a combination thereof. The one or more openings 944 can include a plurality of orifices distributed on the gas distribution plate 941 in a rectilinear pattern. Alternatively, the one or more openings 944 can include a plurality of orifices distributed on the gas distribution plate 941 in a circular pattern (e.g., orifices are distributed in a radial direction or angular direction or both). When the one or more heating elements 952 are located at the outlet 946 of the gas distribution system 900, each heating element can be positioned such that the flow of film forming composition exiting from the one or more openings 944 of gas distribution plate 941 pass by or over each heating element.

Additionally, the plurality of openings 944 can be distributed in various density patterns on the gas distribution plate 941. For example, more openings can be formed near the center of the gas distribution plate 941 and less openings can be formed near the periphery of the gas distribution plate 941. Alternatively, for example, more openings can be formed near the periphery of the gas distribution plate 941 and less openings can be formed near the center of the gas distribution plate 941. Additionally yet, the size of the openings can vary on the gas distribution plate 941. For example, larger openings can be formed near the center of the gas distribution plate 941 and smaller openings can be formed near the periphery of the gas distribution plate 941. Alternatively, for example, smaller openings can be formed near the periphery of the gas distribution plate 941 and larger openings can be formed near the center of the gas distribution plate 941.

Referring still to FIG. 9, the gas distribution system 900 may comprise an optional intermediate gas distribution plate 960 coupled to housing 940 such that the combination of housing 940, intermediate gas distribution plate 960 and gas distribution plate 941 form an intermediate plenum 945 separate from plenum 942 and between the intermediate gas distribution plate 960 and the gas distribution plate 941. The gas distribution system 900 is configured to receive a film forming composition into the plenum 942 from a film forming composition delivery system (not shown) and distribute the film forming composition through the intermediate plenum 945 to the process space 933 of the process chamber.

The intermediate gas distribution plate 960 comprises a plurality of openings 962 arranged to distribute and introduce the film forming composition to the intermediate plenum 945. The plurality of openings 962 can be shaped, arranged, distributed or sized as described above.

In alternative embodiments, the gas distribution system may include a gas ring, a gas nozzle, an array of gas nozzles, or combinations thereof.

Figure 8A:
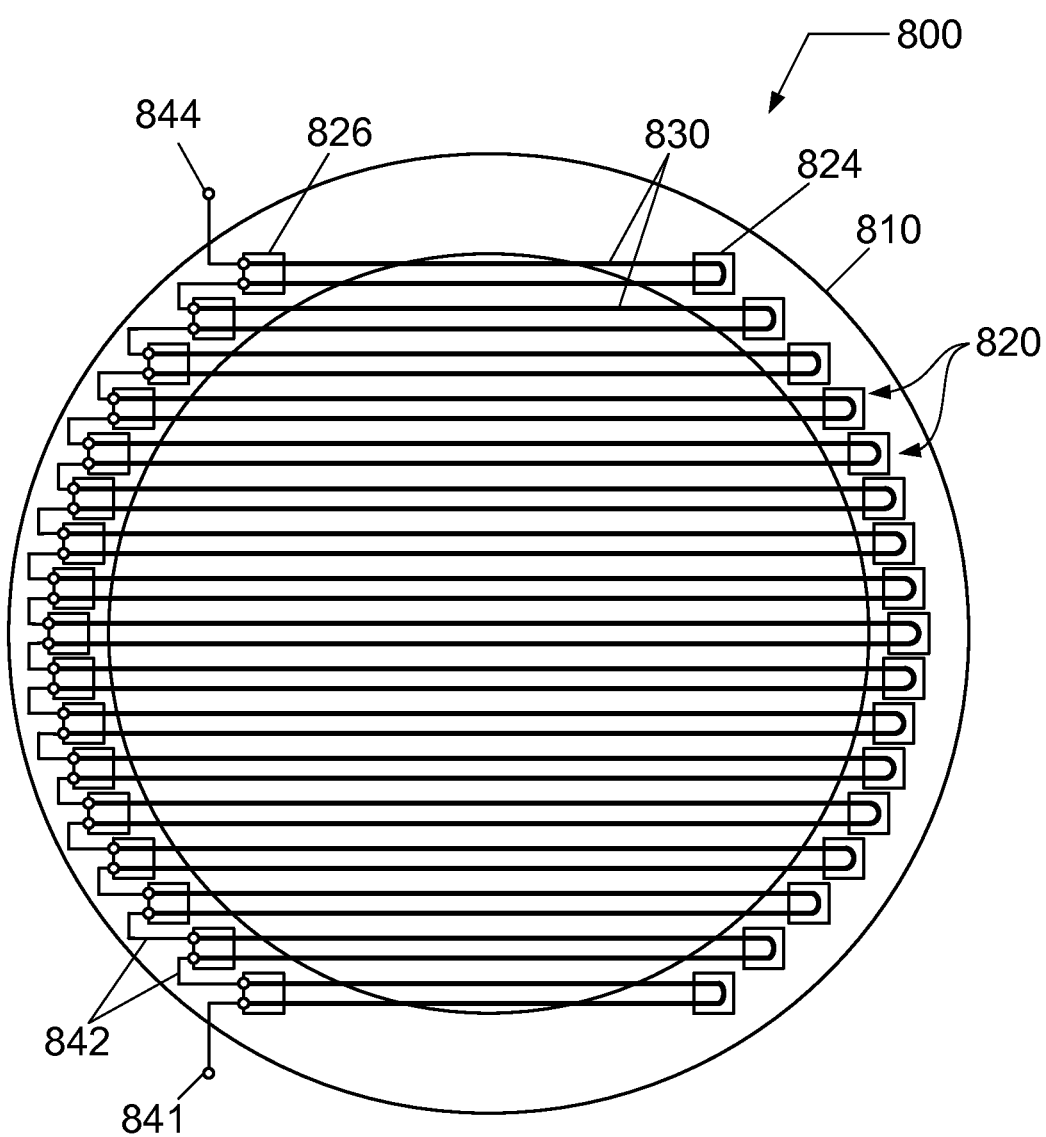
FIG. 8A provides a top view of a gas heating device according to an embodiment.

Referring now to FIG. 8A, a top view of a gas heating device 800 is presented according to an embodiment. The gas heating device 800 is configured to heat one or more constituents of a film forming composition. The gas heating device 800 comprises one or more heat sources 820, wherein each heat source 820 comprises a resistive heating element 830 configured to receive an electrical current from one or more power sources. Additionally, the gas heating device 800 comprises a mounting structure 810 configured to support the one or more resistive heating elements 830. Furthermore, the one or more heat sources 820 may be mounted between the mounting structure 810 and an auxiliary mounting structure 812 (see FIGS. 8C and 8D).

As shown in FIG. 8A, the gas heating device 800 comprises one or more static mounting devices 826 coupled to the mounting structure 810 and configured to fixedly couple the one or more resistive heating elements 830 to the mounting structure 810, and the gas heating device 800 comprises one or more dynamic mounting devices 824 coupled to the mounting structure 810 and configured to automatically compensate for changes in a length of each of the one or more resistive heating elements 830. Further yet, the one or more dynamic mounting devices 824 may substantially reduce slippage between the one or more resistive heating elements 830 and the one or more dynamic mounting devices 824.

The one or more resistive heating elements 830 may be electrically coupled in series, as shown in FIG. 8A, using electrical interconnects 842, wherein electrical current is supplied to the serial connection of one or more resistive heating elements 830 via, for example, connection of a first terminal 841 to the power source and a second terminal 844 to electrical ground for the power source. Alternatively, the one or more resistive heating elements 830 may be electrically coupled in parallel.

Figure 8B:
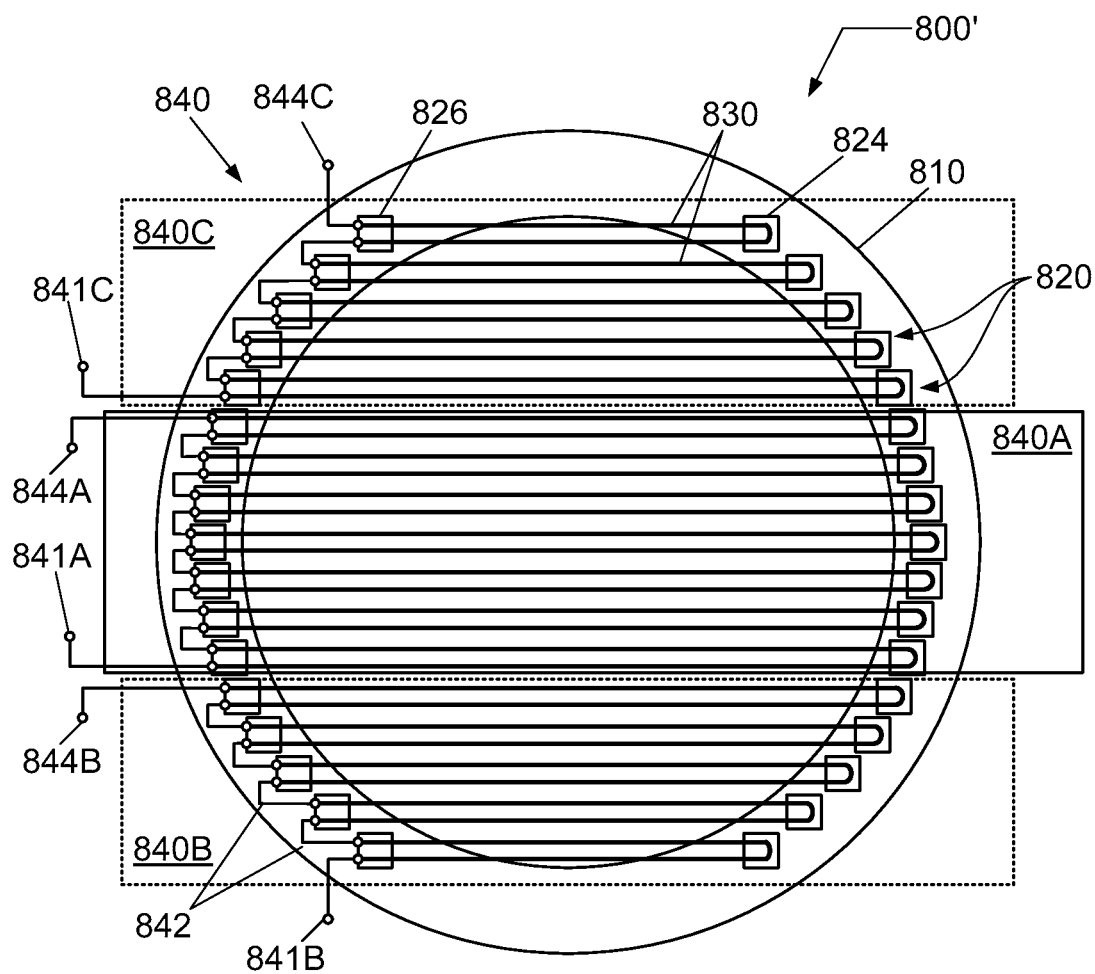
FIG. 8B provides a top view of a gas heating device according to another embodiment.

Referring now to FIG. 8B, a top view of a gas heating device 800' is presented according to another embodiment. The gas heating device 800' can be similar to the embodiment of FIG. 8A, and can further comprise a plurality of heating element zones 840 (A-C), each of which is electrically independent of one another. Each of the plurality of heating element zones 840 (A-C) comprises one or more heat sources 820, wherein each heat source 820 comprises resistive heating element 830 configured to receive an electrical current from one or more power sources.

The one or more resistive heating elements 830 may be electrically coupled in series, as shown in FIG. 8B, using electrical interconnects 842, wherein electrical current is supplied to the serial connection of one or more resistive heating elements 830 via, for example, connection of a first terminal 841 (A-C) to the power source and a second terminal 844 (A-C) to electrical ground for the power source. Alternatively, the one or more resistive heating elements 830 may be electrically coupled in parallel.

Figure 8C:
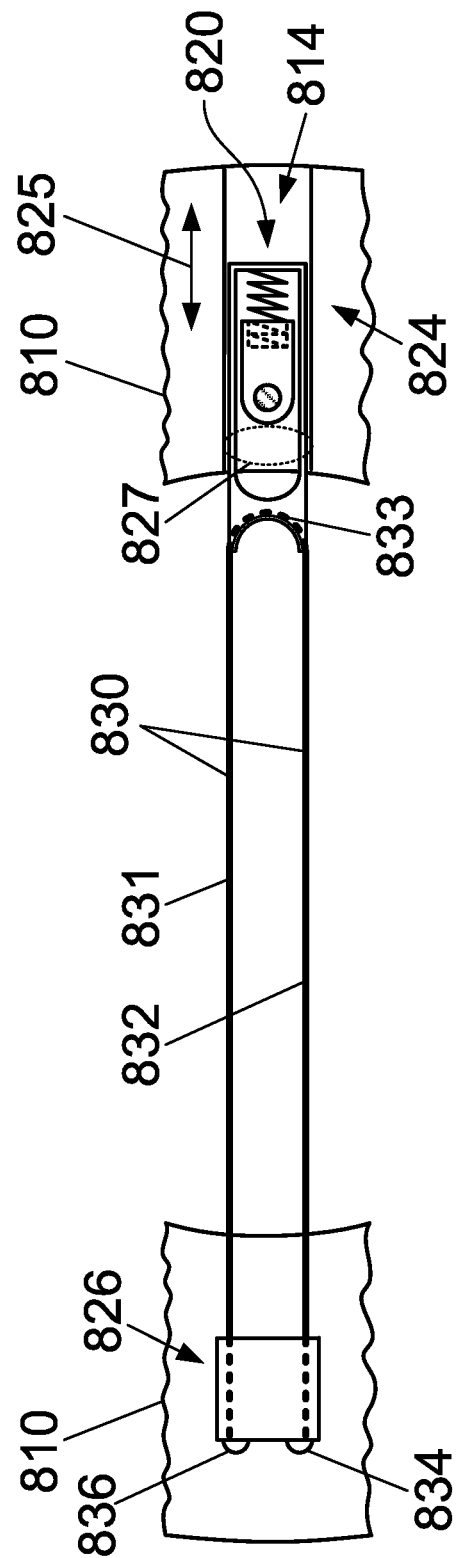
FIG. 8C provides a top view of a heating element according to an embodiment.
Figure 8D:
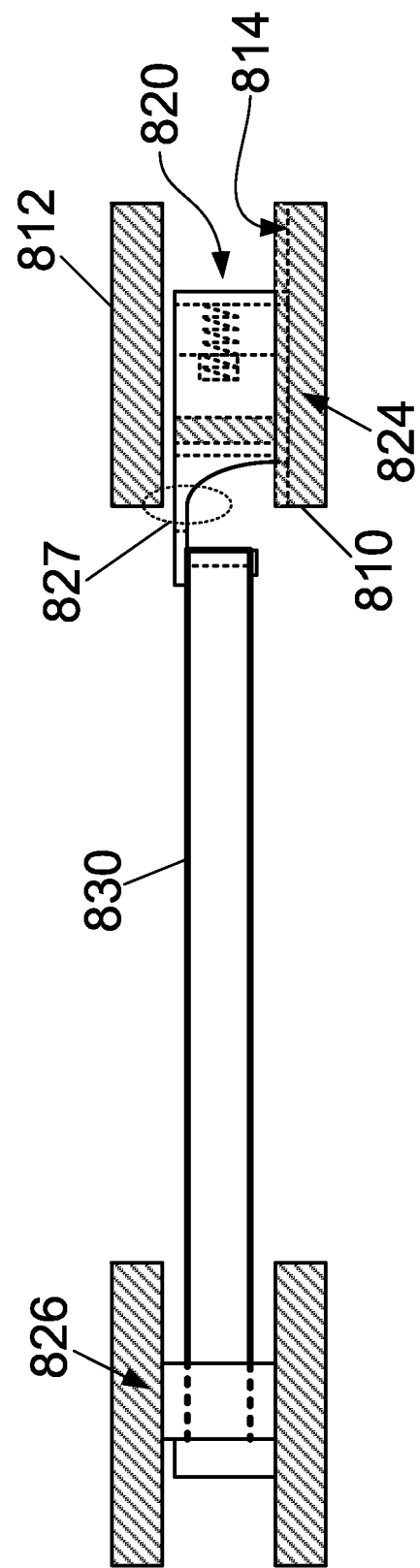
FIG. 8D provides a side view of the heating element shown in FIG. 8C.

Referring now to FIGS. 8C and 8D, a top view and a side view of heat source 820, respectively, is presented according to an embodiment. The resistive heating element 830 comprises a first end 834 fixedly coupled to one of the one or more static mounting devices 826, a second end 836 fixedly coupled to one of the one or more static mounting devices 826, a bend 833 coupled to one of the one or more dynamic mounting devices 824 and located between the first end 834 and the second end 836, a first straight section 832 extending between the first end 834 and the bend 833, and a second straight section 831 extending between the second end 836 and the bend 833. The first end 834 and the second end 836 may be fixedly coupled to the same static mounting device or different static mounting devices.

As illustrated in FIGS. 8C and 8D, the first straight section 832 and the second straight section 831 may be substantially the same length. When the first straight section 832 and the second straight section 831 are substantially the same length, the respective changes in length for the first straight section 832 and the second straight section 831 due to temperature variations are substantially the same. Alternatively, the first straight section 832 and the second straight section 831 may be different lengths.

Also, as illustrated in FIGS. 8C and 8D, the bend 833 comprises a 180 degree bend. Alternatively, the bend 833 comprises a bend ranging from greater than 0 degrees to less than 360 degrees.

The static mounting device 826 is fixedly coupled to the mounting structure 810. The dynamic mounting device 824 is configured to adjust in a linear direction 825 parallel with the first straight section 832 and the second straight section 831 in order to compensate for changes in the length of the first straight section 832 and the length of the second straight section 831. In this embodiment, the dynamic mounting device 824 can alleviate slack or sagging in the resistive heating element 830, and it may substantially reduce or minimize slippage between the resistive heating element 830 and the dynamic mounting device 824 (such slippage may cause particle generation and/or contamination). Furthermore, the dynamic mounting device 824 comprises a thermal break 827 configured to reduce heat transfer between the dynamic mounting device 824 and the mounting structure 810.

Although, the gas distribution systems shown in FIGS. 2 through 5, and FIG. 9 illustrate a single zone, the gas distribution systems can be multiple zones. For example, the gas distribution system can be configured to alter the amount of film forming composition introduced near the center of the substrate relative to the amount of film forming composition introduced near the edge of the substrate.

Additionally, although the gas distribution systems shown in FIGS. 1 through 5, and FIG. 9 illustrate the processing of a substrate oriented in a horizontal plane, the gas distribution system can be configured to distribute a film forming composition to a substrate oriented in a vertical plane. Furthermore, although the gas distribution systems shown in FIGS. 1 through 5, and FIG. 9 illustrate the processing of a substrate, the gas distribution system can be configured to distribute a film forming composition to a plurality of substrates. For example, a plurality of substrates can be oriented in a horizontal plane, or the plurality of substrate can be arranged parallel to one another in a vertical direction.

According to one embodiment, the one or more heating elements comprise a resistive heating element. According to another embodiment, the one or more heating elements comprise a resistive film heating element. According to another embodiment, the one or more heating elements comprise a heating element that is thermally insulated from the gas distribution system. According to another embodiment, the one or more heating elements comprise a heating element in thermal contact with the gas distribution system. According to another embodiment, the one or more heating elements are coupled to at least one interior surface of the gas distribution system. According to yet another embodiment, the one or more heating elements are embedded within the gas distribution system.

Figure 7:
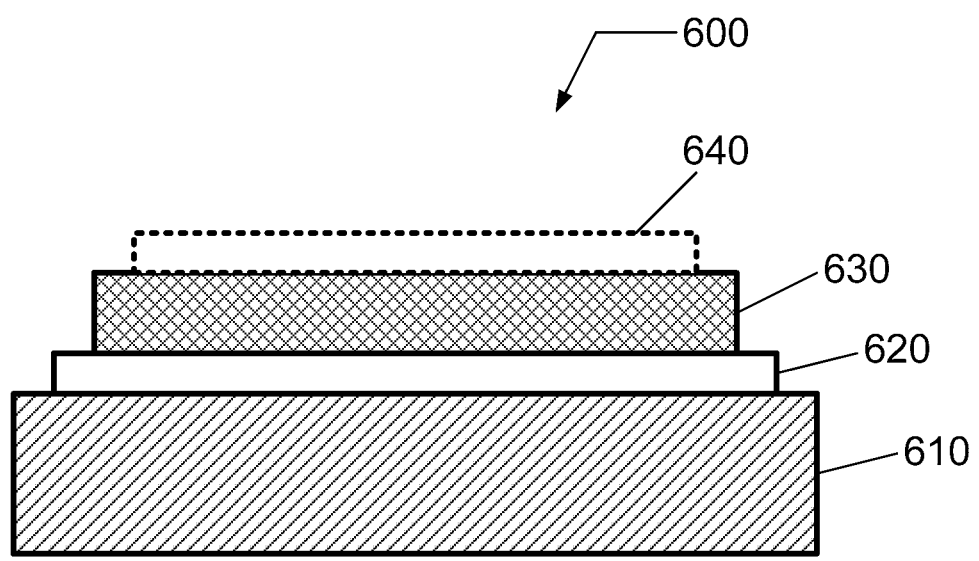
FIG. 7 provides a cross-sectional view of a resistive film heating element according to an embodiment.

Referring now to FIG. 7, a cross-sectional view of a heating element is provided according to another embodiment. A multi-layer resistive film heating element 600 is shown comprising an insulation layer 620 formed on a component 610 having a surface exposed to the interior of a gas distribution system, a resistive heating layer 630 formed on the insulation layer 620, and a protective layer 640 formed on the resistive heating layer 630. For example, component 610 can include a gas distribution plate as described above.

The resistive heating layer 630 can comprise a resistive metal or resistive metal alloy. For example, the resistive heating layer 630 can comprise tungsten, nickel-chromium alloy, aluminum-iron alloy, aluminum nitride, etc. Examples of commercially available materials to fabricate resistive heating layers include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). The resistive heating layer 630 can be formed as a thick film using, for example, spray coating techniques, screen printing techniques, etc. For example, the thick film resistive heating layer 630 can be formed according to techniques commercially provided by Watlow (1310 Kingsland Dr., Batavia, Ill., 60510).

The insulation layer 620 can include a ceramic, plastic or polymer. For example, the insulation layer 620 can include quartz, silicon nitride, sapphire, or alumina, etc. Additionally, the protective layer 640 can include a ceramic, plastic, or polymer. For example, the protective layer 640 can include a spray coating, thermal spray coating or a plasma spray coating of a ceramic material applied over the resistive heating layer 630.

Alternatively, a heating element can include a cartridge heater, a cast-in heater, a flexible heater, etc. commercially available from Watlow (1310 Kingsland Dr., Batavia, Ill., 60510).

Referring again to FIGS. 1A and 1B, the power source 50 is configured to provide electrical power to the one or more resistive film heating elements in the gas distribution system 40. For example, the power source 50 can be configured to deliver either DC power or AC power. Additionally, for example, the power source 50 can be configured to modulate the amplitude of the power, or pulse the power. Furthermore, for example, the power source 50 can be configured to perform at least one of setting, monitoring, adjusting or controlling a power, a voltage, or a current.

Referring still to FIGS. 1A and 1B, a temperature control system 22 can be coupled to the gas distribution system 40, the heat source 45, the process chamber 10 and/or the substrate holder 20, and configured to control the temperature of one or more of these components. The temperature control system 22 can include a temperature measurement system configured to measure the temperature of the gas distribution system 40 at one or more locations, the temperature of the heat source 45 at one or more locations, the temperature of the process chamber 10 at one or more locations and/or the temperature of the substrate holder 20 at one or more locations. The measurements of temperature can be used to adjust or control the temperature at one or more locations in deposition system (1, 1').

The temperature measuring device, utilized by the temperature measurement system, can include an optical fiber thermometer, an optical pyrometer, a band-edge temperature measurement system as described in pending U.S. patent application Ser. No. 10/168,544, filed on Jul. 2, 2002, the contents of which are incorporated herein by reference in their entirety, or a thermocouple such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

Alternatively, when measuring the temperature of one or more resistive heating elements, the electrical characteristics of each resistive heating element can be measured. For example, two or more of the voltage, current or power coupled to the one or more resistive heating elements can be monitored in order to measure the resistance of each resistive heating element. The variations of the element resistance can arise due to variations in temperature of the element which affects the element resistivity.

According to program instructions from the temperature control system 22 or the controller 80 or both, the power source 50 can be configured to operate the heat source 45, e.g., the one or more heating elements, at a temperature ranging from approximately 100 degrees C. to approximately 1500 degrees C. For example, the temperature can range from approximately 200 degrees C. to approximately 700 degrees C., or approximately 600 degrees C. to approximately 1100 degrees C. The temperature can be selected based upon the film forming composition and, more particularly, the temperature can be selected based upon a constituent of the film forming composition.

Additionally, according to program instructions from the temperature control system 22 or the controller 80 or both, the temperature of the gas distribution system 40 can be set to a value approximately equal to or less than the temperature of the heat source 45, i.e., the one or more heating elements. For example, the temperature can be a value less than or equal to approximately 600 degrees C. Additionally, for example, the temperature can be a value less than approximately 550 degrees C. Further yet, for example, the temperature can range from approximately 80 degrees C. to approximately 550 degrees C. The temperature can be selected to be approximately equal to or less than the temperature of the one or more heating elements, and to be sufficiently high to prevent condensation which may or may not cause film formation on surfaces of the gas distribution system and reduce the accumulation of residue.

Additionally yet, according to program instructions from the temperature control system 22 or the controller 80 or both, the temperature of the process chamber 10 can be set to a value less than the temperature of the heat source 45, i.e., the one or more heating elements. For example, the temperature can be a value less than approximately 200 degrees C. Additionally, for example, the temperature can be a value less than approximately 150 degrees C. Further yet, for example, the temperature can range from approximately 80 degrees C. to approximately 150 degrees C. However, the temperature may be the same or less than the temperature of the gas distribution system 40. The temperature can be selected to be less than the temperature of the one or more resistive film heating elements, and to be sufficiently high to prevent condensation which may or may not cause film formation on surfaces of the process chamber and reduce the accumulation of residue.

Once film forming composition enters the process space 33, the film forming composition adsorbs on the substrate surface, and film forming reactions proceed to produce a thin film on the substrate 25. According to program instructions from the temperature control system 22 or the controller 80 or both, the substrate holder 20 is configured to set the temperature of substrate 25 to a value less than the temperature of the heat source 45, the temperature of the gas distribution system 40, and the process chamber 10. For example, the substrate temperature can range up to approximately 80 degrees C.

Additionally, the substrate temperature can be approximately room temperature. For example, the substrate temperature can range up to approximately 25 degrees C. However, the temperature may be less than or greater than room temperature.

The substrate holder 20 comprises one or more temperature control elements coupled to the temperature control system 22. The temperature control system 22 can include a substrate heating system, or a substrate cooling system, or both. For example, substrate holder 20 can include a substrate heating element or substrate cooling element (not shown) beneath the surface of the substrate holder 20. For instance, the heating system or cooling system can include a re-circulating fluid flow that receives heat from substrate holder 20 and transfers heat to a heat exchanger system (not shown) when cooling, or transfers heat from the heat exchanger system to the substrate holder 20 when heating. The cooling system or heating system may include heating/cooling elements, such as resistive heating elements, or thermo-electric heaters/coolers located within substrate holder 20. Additionally, the heating elements or cooling elements or both can be arranged in more than one separately controlled temperature zone. The substrate holder 20 may have two thermal zones, including an inner zone and an outer zone. The temperatures of the zones may be controlled by heating or cooling the substrate holder thermal zones separately.

Additionally, the substrate holder 20 comprises a substrate clamping system (e.g., electrical or mechanical clamping system) to clamp the substrate 25 to the upper surface of substrate holder 20. For example, substrate holder 20 may include an electrostatic chuck (ESC).

Furthermore, the substrate holder 20 can facilitate the delivery of heat transfer gas to the back-side of substrate 25 via a backside gas supply system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25.

Vacuum pumping system 60 can include a turbo-molecular vacuum pump (TMP) capable of a pumping speed up to approximately 5000 liters per second (and greater) and a gate valve for throttling the chamber pressure. For example, a 1000 to 3000 liter per second TMP can be employed. TMPs can be used for low pressure processing, typically less than approximately 1 Torr. For high pressure processing (i.e., greater than approximately 1 Torr), a mechanical booster pump and dry roughing pump can be used. Furthermore, a device for monitoring chamber pressure (not shown) can be coupled to the process chamber 10. The pressure measuring device can be, for example, a Type 628B Baratron absolute capacitance manometer commercially available from MKS Instruments, Inc. (Andover, Mass.).

As shown in FIGS. 1A and 1B, the deposition system (1, 1') may further include a remote source 70 for introducing one or more additives before, during, and/or after the introducing of the film forming composition. The one or more additives may be used to pre-treat a surface on the substrate 25, post-treat a surface on the substrate 25, or assist the film forming reactions on a surface of the substrate 25. The remote source 70 may include a remote plasma generator, a remote radical generator, a remote ozone generator, or a remote water vapor generator, or any combination of two or more thereof. For example, the remote source 70 may produce a reactive composition configured to alter the existing surface functionality of a substrate surface, create a new surface functionality at a substrate surface, improve adhesion at a substrate surface for a subsequent layer, hydrolyze a substrate surface, alter the film-forming chemistry at a substrate surface, etc.

The reactive composition may include atomic species, molecular species, excited species, metastable species, dissociated species, radical species, ionized species, etc. The reactive composition may include an oxygen-containing environment (e.g., exposure to oxygen-containing plasma, oxygen-containing radical, atomic oxygen, diatomic oxygen, excited oxygen, ionized oxygen, ozone, etc.), a hydrogen-containing environment (e.g., exposure to hydrogen-containing plasma, hydrogen-containing radical, atomic hydrogen, diatomic hydrogen, excited hydrogen, metastable hydrogen, ionized hydrogen, etc.), a nitrogen-containing environment (e.g., exposure to nitrogen-containing plasma, nitrogen-containing radical, atomic nitrogen, diatomic nitrogen, excited nitrogen, metastable nitrogen, ionized nitrogen, etc.), a peroxide, a water vapor environment (e.g., water vapor, hydroxyl radical, hydroxide ion, atomic hydrogen, excited hydrogen, metastable hydrogen, ionized hydrogen, etc.), etc. For example, the remote source 70 may be configured to supply an oxygen-containing additive, such as ionized oxygen, to the deposition system (1, 1') during the introduction of the film forming composition.

As an example, the remote plasma generator may include an upstream plasma source configured to generate the reactive composition. The remote plasma generator may include an ASTRON® reactive gas generator, commercially available from MKS Instruments, Inc., ASTeX® Products (90 Industrial Way, Wilmington, Mass. 01887).

As shown in FIG. 1A, a gas injection system 72 may be coupled to an outlet of the remote source 70, and configured to introduce the reactive composition to the process chamber 10 within a plane above the substrate 25 and below the one or more heating elements 55. Furthermore, the gas injection system 72 comprises a plurality of gas nozzles arranged in the process chamber 10 beyond a peripheral edge of the one or more heating elements 55.

The deposition system (1, 1') may include a first gas line 74A coupling an outlet of the remote source 70 to the gas injection system 72 through a first gas valve 75A to permit a first flow of the reactive composition to the process chamber 10, and a second gas line 74B coupling the outlet of the remote source 70 to the duct 62 through a second gas valve 75B to permit a second flow of the reactive composition to the vacuum pumping system without passing through the process chamber 10.

Alternatively, as shown in FIG. 1B, a gas injection system 72' comprises a gas injection ring having a plurality of gas nozzles, wherein the gas injection ring may be arranged in the process chamber 10 above the substrate 25 and below the one or more heating elements 55. Furthermore, the gas injection system 72' comprises a gas injection ring arranged in the process chamber 10 beyond a peripheral edge of the one or more heating elements 55.

Referring still to FIGS. 1A and 1B, the deposition system (1, 1') can further comprise a controller 80 that comprises a microprocessor, memory, and a digital I/O port capable of generating control voltages sufficient to communicate and activate inputs to deposition system (1, 1') as well as monitor outputs from deposition system (1, 1'). Moreover, controller 80 can be coupled to and can exchange information with the process chamber 10, the substrate holder 20, the temperature control system 22, the film forming composition delivery system 30, the gas distribution system 40, the heat source 45, the vacuum pumping system 60, and the remote source 70, as well as the backside gas delivery system (not shown), and/or the electrostatic clamping system (not shown). A program stored in the memory can be utilized to activate the inputs to the aforementioned components of deposition system (1, 1') according to a process recipe in order to perform the method of depositing a thin film.

Controller 80 may be locally located relative to the deposition system (1, 1'), or it may be remotely located relative to the deposition system (1, 1') via an internet or intranet. Thus, controller 80 can exchange data with the deposition system (1, 1') using at least one of a direct connection, an intranet, or the internet. Controller 80 may be coupled to an intranet at a customer site (i.e., a device maker, etc.), or coupled to an intranet at a vendor site (i.e., an equipment manufacturer). Furthermore, another computer (i.e., controller, server, etc.) can access controller 80 to exchange data via at least one of a direct connection, an intranet, or the internet.

Additionally, the deposition system (1, 1') can be periodically cleaned using an in-situ cleaning system (not shown) coupled to, for example, the process chamber 10 or the gas distribution system 40. The remote source 70 may be utilized to provide a cleaning composition to the deposition system (1, 1'). Per a frequency determined by the operator, the in-situ cleaning system can perform routine cleanings of the deposition system (1, 1') in order to remove accumulated residue on internal surfaces of deposition system (1, 1'). The in-situ cleaning system can, for example, comprise a radical generator configured to introduce chemical radical capable of chemically reacting and removing such residue. Additionally, for example, the in-situ cleaning system can, for example, include an ozone generator configured to introduce a partial pressure of ozone. For instance, the radical generator can include an upstream plasma source configured to generate oxygen or fluorine radical from oxygen ($O_2$), nitrogen trifluoride (NF), $O_3$, $XeF_2$, $ClF_3$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

Figure 10:
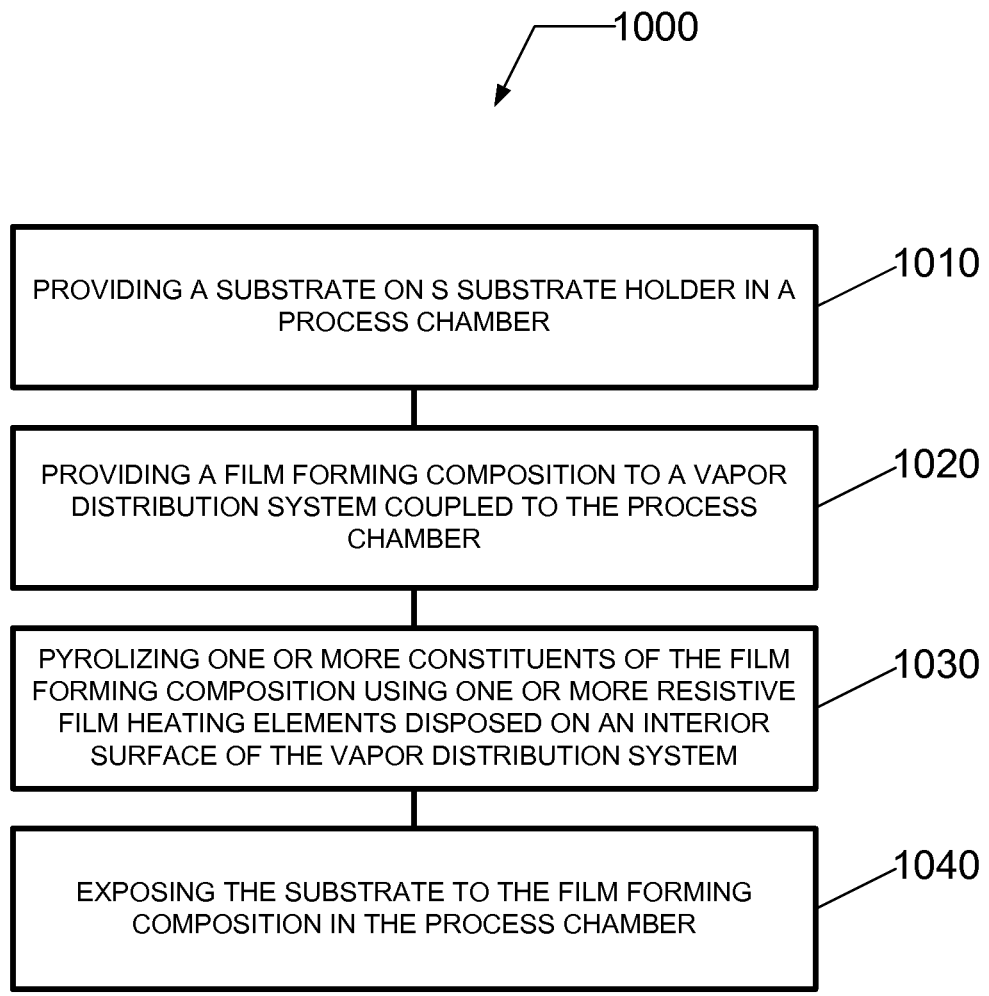
FIG. 10 illustrates a method of depositing a thin film on a substrate according to yet another embodiment.

FIG. 10 illustrates a method of depositing a thin film on a substrate according to another embodiment. The method 1000 includes, at 1010, providing a substrate in a process chamber of a deposition system. For example, the deposition system can include the deposition system described above in FIGS. 1A and 1B. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, the substrate can be a patterned substrate containing one or more vias or trenches, or combinations thereof.

At 1020, a film forming composition is provided to a gas distribution system that is configured to introduce the film forming composition to the process chamber above the substrate. For example, the gas distribution system can be located above the substrate and opposing an upper surface of the substrate.

At 1030, one or more constituents of the film forming composition are subjected to pyrolysis using one or more heating elements, such as one or more resistive film heating elements, disposed on an interior surface of the gas distribution system or embedded within the gas distribution system. The gas distribution system can be any one of the systems described in FIGS. 2 through 5, and FIG. 9 above, or any combination thereof.

At 1040, the substrate is exposed to the film forming composition to facilitate the formation of the thin film. The temperature of the substrate can be set to a value less than the temperature of the one or more heating elements, e.g. one or more resistive film heating elements. For example, the temperature of the substrate can be approximately room temperature.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A deposition system for depositing a thin film on a substrate, comprising:
    a process chamber having a vacuum pumping system configured to evacuate said process chamber;
    a substrate holder coupled to said process chamber and configured to support said substrate;
    a gas distribution system coupled to said process chamber and configured to introduce a film forming composition to a process space in the vicinity of a surface of said substrate;
    a non-ionizing heat source comprising an arrangement of one or more heating elements separate from said substrate holder and positioned to receive a flow of said film forming composition in contact with surfaces of said one or more heating elements to interact therewith and to cause thermal fragmentation of one or more constituents of said film forming composition when said one or more heating elements are heated;
    one or more power sources coupled to said one or more heating elements, and configured to provide an electrical signal to said one or more heating elements; and
    a remote source positioned entirely outside said process chamber and configured to generate a reactive composition in said remote source, and a gas injection system comprising a plurality of gas nozzles positioned inside said process chamber and a gas line providing a coupling between an outlet of said remote source and said plurality of gas nozzles for conveying said reactive composition generated in said remote source entirely outside said process chamber to said plurality of gas nozzles positioned inside said process chamber, and said gas injection system positioned to introduce said reactive composition into said process chamber within a plane above said substrate and below said arrangement of one or more heating elements to chemically interact with said substrate, said remote source comprising a remote plasma generator, a remote radical generator, a remote ozone generator, a remote water vapor generator, or a combination of two or more thereof.

2. The deposition system of claim 1, wherein said one or more heating elements are resistive heating elements, and said arrangement of said one or more heating elements comprises at least one heating element zone configured to receive said flow of said film forming composition across or through said at least one heating element zone to contact said surfaces of said one or more resistive heating elements in order cause thermal fragmentation of one or more constituents of said film forming composition when heated.

3. The deposition system of claim 1, wherein said plurality of gas nozzles are arranged in said process chamber beyond a peripheral edge of said arrangement of said one or more heating elements.

4. The deposition system of claim 1, wherein said gas injection system comprises a gas injection ring having said plurality of gas nozzles, said gas injection ring being arranged in said process chamber above said substrate and below said arrangement of said one or more heating elements.

5. The deposition system of claim 1, wherein said reactive composition includes atomic oxygen, atomic hydrogen, or atomic nitrogen, or both atomic oxygen and atomic nitrogen.

6. The deposition system of claim 1, said gas injection system further comprising:
a first gas valve in said gas line coupling said outlet of said remote source to said plurality of gas nozzles to permit a first flow of said reactive composition to said process chamber; and
a second gas line coupling said outlet of said remote source to said vacuum pumping system through a second gas valve to permit a second flow of said reactive composition to said vacuum pumping system without passing through said process chamber.

7. The deposition system of claim 1, wherein said remote source includes a remote water vapor generator.

8. The deposition system of claim 1, wherein said remote source consists of said remote plasma generator, said remote radical generator, or said remote water vapor generator, or a combination of two or more thereof.

9. The deposition system of claim 2, wherein said arrangement of said one or more heating elements comprises a plurality of heating element zones, each including at least one of said one or more resistive heating elements, and each heating element zone of said plurality of heating element zones configured to receive a portion of said flow of said film forming composition across or through said heating element zone to contact said surfaces of said at least one resistive heating element in order to cause pyrolysis of one or more constituents of said film forming composition when heated, wherein each of said plurality of heating element zones is configured electrically independent of one another, and wherein said arrangement comprising said plurality of heating element zones effects delivery of said film forming composition to different regions of said substrate.

10. The deposition system of claim 9, wherein said gas distribution system is configured to control an amount of said flow of said film forming composition to each of said plurality of heating element zones.

11. The deposition system of claim 2, wherein said gas distribution system comprises a plenum configured to receive said film forming composition, and one or more openings aligned with said one or more resistive heating elements of said at least one heating element zone and configured to distribute and flow said film forming composition over said one or more resistive heating elements.

12. The deposition system of claim 2, wherein at least one of said one or more resistive heating elements comprises a metal-containing ribbon or metal-containing wire, and wherein said one or more power sources comprise a direct current (DC) power source, or an alternating current (AC) power source, or a combination thereof.

13. The deposition system of claim 2, wherein said one or more resistive heating elements of said at least one heating element zone comprises:
a mounting structure configured to support at least one of said one or more resistive heating elements, said mounting structure comprising:
a static mounting device coupled to said mounting structure and configured to fixedly couple said at least one of said one or more resistive heating elements to said mounting structure, and
a dynamic mounting device coupled to said mounting structure and configured to automatically compensate for changes in a length of said at least one of said one or more resistive heating elements,
wherein said dynamic mounting device comprises a thermal break configured to reduce heat transfer between said dynamic mounting device and said mounting structure, and
wherein said at least one of said one or more resistive heating elements comprises a first end fixedly coupled to said static mounting device, a second end fixedly coupled to said static mounting device, a bend coupled to said dynamic mounting device and located between said first end and said second end, a first straight section extending between said first end and said bend, and a second straight section extending between said second end and said bend.

14. The deposition system of claim 1, wherein said substrate holder is coupled to a temperature control system configured to control a temperature of said substrate.

15. The deposition system of claim 1, wherein said substrate holder comprises a backside gas supply system configured to supply a heat transfer gas to a backside of said substrate.

16. The deposition system of claim 15, wherein said backside gas supply system is configured to independently supply said heat transfer gas to a plurality of heat transfer gas supply zones at said backside of said substrate.

17. The deposition system of claim 2, further comprising:
a controller coupled to said one or more power sources, said substrate holder, said gas distribution system, and said remote source, and configured to control a temperature of at least one of said at least one heating element zone, a flow rate of said film forming composition, or a flow rate of said reactive composition, or any combination of two or more thereof.

* * * * *